United States Patent
Lee et al.

(10) Patent No.: US 9,768,255 B2
(45) Date of Patent: Sep. 19, 2017

(54) SEMICONDUCTOR DEVICES INCLUDING CONTACT STRUCTURES THAT PARTIALLY OVERLAP SILICIDE LAYERS

(71) Applicants: Do-Sun Lee, Suwon-si (KR);
Chang-Woo Sohn, Hwaseong-si (KR);
Chul-Sung Kim, Seongnam-si (KR);
Shigenobu Maeda, Seongnam-si (KR);
Young-Moon Choi, Seoul (KR);
Hyo-Seok Choi, Hwaseong-si (KR);
Sang-Jin Hyun, Suwon-si (KR)

(72) Inventors: Do-Sun Lee, Suwon-si (KR);
Chang-Woo Sohn, Hwaseong-si (KR);
Chul-Sung Kim, Seongnam-si (KR);
Shigenobu Maeda, Seongnam-si (KR);
Young-Moon Choi, Seoul (KR);
Hyo-Seok Choi, Hwaseong-si (KR);
Sang-Jin Hyun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/006,717

(22) Filed: Jan. 26, 2016

(65) Prior Publication Data
US 2016/0308004 A1    Oct. 20, 2016

(30) Foreign Application Priority Data
Apr. 14, 2015    (KR) .................. 10-2015-0052355

(51) Int. Cl.
*H01L 29/08*    (2006.01)
*H01L 29/06*    (2006.01)
(Continued)

(52) U.S. Cl.
CPC ...... *H01L 29/0847* (2013.01); *H01L 29/0653* (2013.01); *H01L 29/161* (2013.01);
(Continued)

(58) Field of Classification Search
CPC ............. H01L 29/0847; H01L 29/0653; H01L 29/161; H01L 29/165; H01L 29/7848; H01L 29/41791; H01L 29/785
See application file for complete search history.

(56) References Cited

U.S. PATENT DOCUMENTS 7,456,471 B2 * 11/2008 Anderson ......... H01L 29/41791
                                                  257/331
7,679,133 B2    3/2010 Son et al.
(Continued)

FOREIGN PATENT DOCUMENTS

JP    4960007 B2    6/2012
JP    5489992 B2    5/2014
(Continued)

*Primary Examiner* — Long Pham
(74) *Attorney, Agent, or Firm* — Myers Bigel, P.A.

(57) ABSTRACT

Semiconductor devices are provided. A semiconductor device includes a substrate. The semiconductor device includes an isolation layer defining active portions of the substrate that are spaced apart from each other in a direction. The semiconductor device includes an epitaxial layer on the active portions. The semiconductor device includes a metal silicide layer on the epitaxial layer. Moreover, the semiconductor device includes a contact structure that only partially overlaps the metal silicide layer on the epitaxial layer. Related methods of forming semiconductor devices are also provided.

19 Claims, 25 Drawing Sheets

(51) Int. Cl.
   *H01L 29/161*   (2006.01)
   *H01L 29/165*   (2006.01)
   *H01L 29/78*    (2006.01)
   *H01L 29/417*   (2006.01)

(52) U.S. Cl.
   CPC ...... *H01L 29/165* (2013.01); *H01L 29/41791* (2013.01); *H01L 29/785* (2013.01); *H01L 29/7848* (2013.01)

(56) References Cited

U.S. PATENT DOCUMENTS

| | | |
|---|---|---|
| 8,399,938 B2 | 3/2013 | Cheng et al. |
| 8,553,466 B2 | 10/2013 | Han et al. |
| 8,559,235 B2 | 10/2013 | Yoon et al. |
| 8,653,630 B2 | 2/2014 | Liaw et al. |
| 8,654,587 B2 | 2/2014 | Yoon et al. |
| 2007/0252211 A1 | 11/2007 | Yagishita |
| 2008/0315309 A1 | 12/2008 | Chang et al. |
| 2011/0233648 A1 | 9/2011 | Seol et al. |
| 2013/0187206 A1 | 7/2013 | Mor et al. |
| 2013/0187228 A1 | 7/2013 | Xie et al. |
| 2013/0248999 A1 | 9/2013 | Glass et al. |
| 2013/0277752 A1 | 10/2013 | Glass et al. |
| 2014/0097496 A1 | 4/2014 | Hu et al. |
| 2014/0239395 A1 | 8/2014 | Basker et al. |
| 2014/0273365 A1 | 9/2014 | Wei et al. |
| 2014/0273369 A1 | 9/2014 | Wei et al. |
| 2014/0273397 A1 | 9/2014 | Rodder et al. |

FOREIGN PATENT DOCUMENTS

| | | |
|---|---|---|
| KR | 10-2013-0086272 A | 8/2013 |
| KR | 10-2013-0111595 | 10/2013 |
| KR | 10-2014-0097462 | 8/2014 |
| KR | 10-1435739 B1 | 8/2014 |
| KR | 10-2014-0112374 A | 9/2014 |

\* cited by examiner

FIRST      SECOND
DIRECTION  DIRECTION

SEMICONDUCTOR DEVICES INCLUDING CONTACT STRUCTURES THAT PARTIALLY OVERLAP SILICIDE LAYERS

CROSS-REFERENCE TO RELATED APPLICATION

This U.S. non-provisional patent application claims priority under 35 USC §119 to Korean Patent Application No. 10-2015-0052355, filed on Apr. 14, 2015, in the Korean Intellectual Property Office (KIPO), the entire contents of which are hereby incorporated herein by reference.

BACKGROUND

The present disclosure relates to semiconductor devices. A semiconductor device including a FinFET may include an epitaxial layer structure in a source/drain region, and a wiring structure may be formed to be electrically connected to the epitaxial layer structure in the source/drain region.

SUMMARY

Example embodiments may provide a semiconductor device including a FinFET having good characteristics. Moreover, some example embodiments may provide a method of manufacturing the semiconductor device.

According to example embodiments, the semiconductor device may include an epitaxial layer structure and a metal silicide pattern covered with the top surface of the epitaxial layer structure, so that a resistance of the semiconductor device may decrease. Additionally, portions of a contact structure and a gate structure facing each other may decrease, so that a parasitic capacitance may be reduced.

A method of forming a semiconductor device, according to various embodiments, may include forming an epitaxial layer on active portions of a substrate that are defined by an isolation layer therebetween. The method may include forming a metal layer on the epitaxial layer. The method may include performing a silicidation process to react the epitaxial layer and the metal layer with each other to form a metal silicide layer. Moreover, the method may include forming a contact structure that only partially overlaps the metal silicide layer on the epitaxial layer. In some embodiments, the method may include forming an insulating interlayer on the metal silicide layer, and forming a contact hole in the insulating interlayer to expose a surface of the metal silicide layer. Forming the contact structure may include forming the contact structure on the exposed surface of the metal silicide layer.

According to various embodiments, forming the contact structure on the exposed surface of the metal silicide layer may include forming the contact structure on less than half of an entire uppermost surface of the metal silicide layer. Moreover, in some embodiments, forming the contact hole may include etching a first portion of the exposed surface of the metal silicide layer while using the insulating interlayer to block a second portion of the metal silicide layer from the etching.

In various embodiments, the method may include forming dummy gate structures on an active fin structure. Forming the metal layer may include forming the metal layer on the epitaxial layer, the dummy gate structures, and the isolation layer. Performing a silicidation process may include forming the metal silicide layer on portions of the epitaxial layer that are between the dummy gate structures. In some embodiments, the method may include removing the dummy gate structures and forming metal gate structures in place of the dummy gate structures. In some embodiments, forming the epitaxial layer may include forming an epitaxial source/drain region of a fin-shaped Field Effect Transistor (FinFET). Moreover, performing the silicidation process may include siliciding the epitaxial source/drain region before removing the dummy gate structures.

According to various embodiments, the method may include forming a dummy gate structure on an active fin structure. Forming the epitaxial layer may include forming first and second epitaxial source/drain patterns on first and second sides, respectively, of the dummy gate structure. The method may include removing the dummy gate structure. Moreover, the method may include forming a metal gate structure in place of the dummy gate structure, between the first and second epitaxial source/drain patterns.

In various embodiments, the method may include forming dummy gate structures on an active fin structure. The method may include forming a sacrificial insulating layer on the epitaxial layer. The method may include removing the dummy gate structures. The method may include forming metal gate structures in place of the dummy gate structures. The method may include removing the sacrificial insulating layer to expose the epitaxial layer. Moreover, forming the metal layer may include forming the metal layer on the epitaxial layer after forming the metal gate structures and after removing the sacrificial insulating layer, and performing the silicidation process may include forming the metal silicide layer after forming the metal gate structures and after removing the sacrificial insulating layer.

According to various embodiments, forming the epitaxial layer may include forming a plurality of epitaxial patterns on respective ones of the active portions of the substrate. Each of the plurality of epitaxial patterns may have a polygonal shape. Moreover, performing the silicidation process may include forming the metal silicide layer on a plurality of sides of the polygonal shape of each of the plurality of epitaxial patterns.

In some embodiments, performing the silicidation process may include forming the metal silicide layer on at least five sides of the polygonal shape of each of the plurality of epitaxial patterns. In some embodiments, forming the plurality of epitaxial patterns on respective ones of the active portions of the substrate may include forming each of the plurality of epitaxial patterns to contact at least another one of the plurality of epitaxial patterns. In some embodiments, forming the plurality of epitaxial patterns on respective ones of the active portions of the substrate may include forming the plurality of epitaxial patterns with gaps therebetween. In some embodiments, performing the silicidation process may include forming the metal silicide layer to electrically connect the plurality of epitaxial patterns with each other. Moreover, in some embodiments, forming the contact structure may include forming the contact structure to overlap only one of the plurality of epitaxial patterns.

In various embodiments, forming the epitaxial layer may include forming a first plurality of epitaxial patterns and a second plurality of epitaxial patterns that is spaced apart from the first plurality of epitaxial patterns. Moreover, forming the contact structure may include forming first and second contact structures on the first plurality of epitaxial patterns and the second plurality of epitaxial patterns, respectively. In some embodiments, forming the epitaxial layer may include forming the second plurality of epitaxial patterns to be spaced apart from the first plurality of epitaxial patterns in a direction. In some embodiments, forming the first and second contact structures may include forming the first and second contact structures in a pattern that defines an acute angle with the direction.

According to various embodiments, forming the epitaxial layer may include forming first through third pluralities of epitaxial patterns that are spaced apart from each other in a first direction. Moreover, forming the contact structure may include forming first through third contact structures on the first through third pluralities of epitaxial patterns, respectively, to be at different positions from each other in a second direction that is perpendicular to the first direction, when viewed in a plan view. In some embodiments, forming the first through third contact structures may include forming the first through third contact structures on the first through third pluralities of epitaxial patterns, respectively, to define a zig-zag pattern when viewed in the plan view.

In various embodiments, the method may include forming a fin-shaped portion of the substrate by recessing the substrate. Forming the epitaxial layer may include forming the epitaxial layer on the fin-shaped portion of the substrate.

A semiconductor device, according to various embodiments, may include a substrate. The semiconductor device may include an isolation layer defining active portions of the substrate that are spaced apart from each other in a direction. The semiconductor device may include an epitaxial layer on the active portions. The semiconductor device may include a metal silicide layer on the epitaxial layer. Moreover, the semiconductor device may include a contact structure that only partially overlaps the metal silicide layer on the epitaxial layer. In some embodiments, the semiconductor device may include an insulating interlayer on the metal silicide layer, and the contact structure may be in a contact hole in the insulating interlayer. In some embodiments, the contact structure may be on less than half of an entire uppermost surface of the metal silicide layer. In some embodiments, a first thickness of a first portion of the metal silicide layer underlying the contact structure may be thinner than a second thickness of a second portion of the metal silicide layer underlying the insulating interlayer.

In various embodiments, the epitaxial layer may be an epitaxial source/drain region of a fin-shaped Field Effect Transistor (FinFET), and the metal silicide layer may be on the epitaxial source/drain region. In some embodiments, the direction in which the active portions of the substrate are spaced apart may be a first direction, and the semiconductor device may include metal gate structures that are spaced part from each other in a second direction on an active fin structure.

According to various embodiments, the epitaxial layer may include a plurality of epitaxial patterns on respective ones of the active portions of the substrate. Each of the plurality of epitaxial patterns may have a polygonal shape. The metal silicide layer may be on a plurality of sides of the polygonal shape of each of the plurality of epitaxial patterns. In some embodiments, the metal silicide layer may be on at least three sides of the polygonal shape of each of the plurality of epitaxial patterns. In some embodiments, the metal silicide layer may be on at least five sides of the polygonal shape of each of the plurality of epitaxial patterns.

In various embodiments, the plurality of epitaxial patterns may have respective first through third ones of the polygonal shapes, and the second polygonal shape may contact each of the first and third polygonal shapes. In some embodiments, the plurality of epitaxial patterns may have gaps therebetween and the metal silicide layer may electrically connect the plurality of epitaxial patterns with each other. In some embodiments, the contact structure may overlap only one of the plurality of epitaxial patterns. In some embodiments, the contact structure may overlap only two of the plurality of epitaxial patterns.

According to various embodiments, the direction in which the active portions of the substrate are spaced apart may be a first direction. The epitaxial layer may include a first plurality of epitaxial patterns and a second plurality of epitaxial patterns that is spaced apart from the first plurality of epitaxial patterns in a second direction. Moreover, the contact structure may include first and second contact structures on the first plurality of epitaxial patterns and the second plurality of epitaxial patterns, respectively. In some embodiments, the first and second contact structures may be in a pattern that defines an acute angle with the second direction.

In various embodiments, the direction in which the active portions of the substrate are spaced apart may be a first direction. The epitaxial layer may include first through third pluralities of epitaxial patterns that are spaced apart from each other in a second direction. Moreover, the contact structure may include first through third contact structures on the first through third pluralities of epitaxial patterns, respectively, and may be at different positions from each other in the first direction when viewed in a plan view. In some embodiments, the first through third contact structures on the first through third pluralities of epitaxial patterns, respectively, may define a zig-zag pattern when viewed in the plan view.

According to various embodiments, the semiconductor device may include a metal gate structure, and the epitaxial layer may include first and second epitaxial source/drain patterns on first and second sides, respectively, of the metal gate structure. In some embodiments, the contact structure may include a barrier metal layer that only partially overlaps the metal silicide layer on the epitaxial layer, and may include a metal layer on the barrier metal layer. Moreover, in some embodiments, the metal layer may include at least one of copper, tungsten, and aluminum.

In various embodiments, the metal silicide layer may extend to a portion of the epitaxial layer that is spaced apart from the contact structure.

A semiconductor device, according to various embodiments, may include a substrate including a plurality of fin-shaped patterns. The semiconductor device may include a plurality of metal gate structures on respective ones of the plurality of fin-shaped patterns. The semiconductor device may include a plurality of epitaxial source/drain patterns on the plurality of fin-shaped patterns. The semiconductor device may include a plurality of metal silicide layers on respective ones of the plurality of epitaxial source/drain patterns. Moreover, the semiconductor device may include a plurality of contact structures on, and only partially overlapping, respective ones of the plurality of metal silicide layers.

In various embodiments, the plurality of metal silicide layers may be on entireties of surface areas of respective uppermost surfaces of the plurality of epitaxial source/drain patterns. In some embodiments, the plurality of contact structures may be on less than half of surface areas of respective uppermost surfaces of the plurality of metal silicide layers.

A method of forming a semiconductor device, according to various embodiments, may include forming a plurality of fin-shaped patterns in a substrate. The method may include forming a plurality of dummy gate structures on respective ones of the plurality of fin-shaped patterns. The method may include forming a plurality of epitaxial source/drain patterns on the plurality of fin-shaped patterns. The method may include forming a plurality of metal silicide layers on respective ones of the plurality of epitaxial source/drain patterns. The method may include removing the plurality of dummy gate structures. The method may include forming a plurality of metal gate structures in place of the plurality of dummy gate structures. Moreover, the method may include forming a plurality of contact structures on, and only partially overlapping, respective ones of the plurality of metal silicide layers.

In various embodiments, the method may include forming an insulating interlayer on the plurality of metal silicide layers. Moreover, the method may include forming a plurality of contact holes in the insulating interlayer to expose respective surfaces of the plurality of metal silicide layers. Forming the plurality of contact structures may include forming the plurality of contact structures on less than half of surface areas of respective uppermost surfaces of the plurality of metal silicide layers.

BRIEF DESCRIPTION OF THE DRAWINGS

Example embodiments will be more clearly understood from the following detailed description taken in conjunction with the accompanying drawings.

FIGS. 1 and 2 are a perspective view and a cross-sectional view, respectively, illustrating a semiconductor device including a FinFET in accordance with example embodiments.

FIGS. 3 to 12 are cross-sectional views and a perspective view illustrating stages of a method of manufacturing the semiconductor device in accordance with example embodiments.

FIGS. 13 to 17 are cross-sectional views and a perspective view illustrating stages of a method of manufacturing the semiconductor device in accordance with example embodiments.

FIGS. 18 and 19 are a perspective view and a cross-sectional view, respectively, illustrating a semiconductor device including a FinFET in accordance with example embodiments.

FIG. 20 is a cross-sectional view illustrating stages of a method of manufacturing the semiconductor device in accordance with example embodiments.

FIGS. 21 and 22 are a perspective view and a cross-sectional view, respectively, illustrating a semiconductor device including a FinFET in accordance with example embodiments.

FIGS. 23 and 24 are a perspective view and a cross-sectional view, respectively, illustrating a semiconductor device including a FinFET in accordance with example embodiments.

FIG. 25 is a block diagram illustrating a system in accordance with example embodiments.

DETAILED DESCRIPTION

Figure 1:
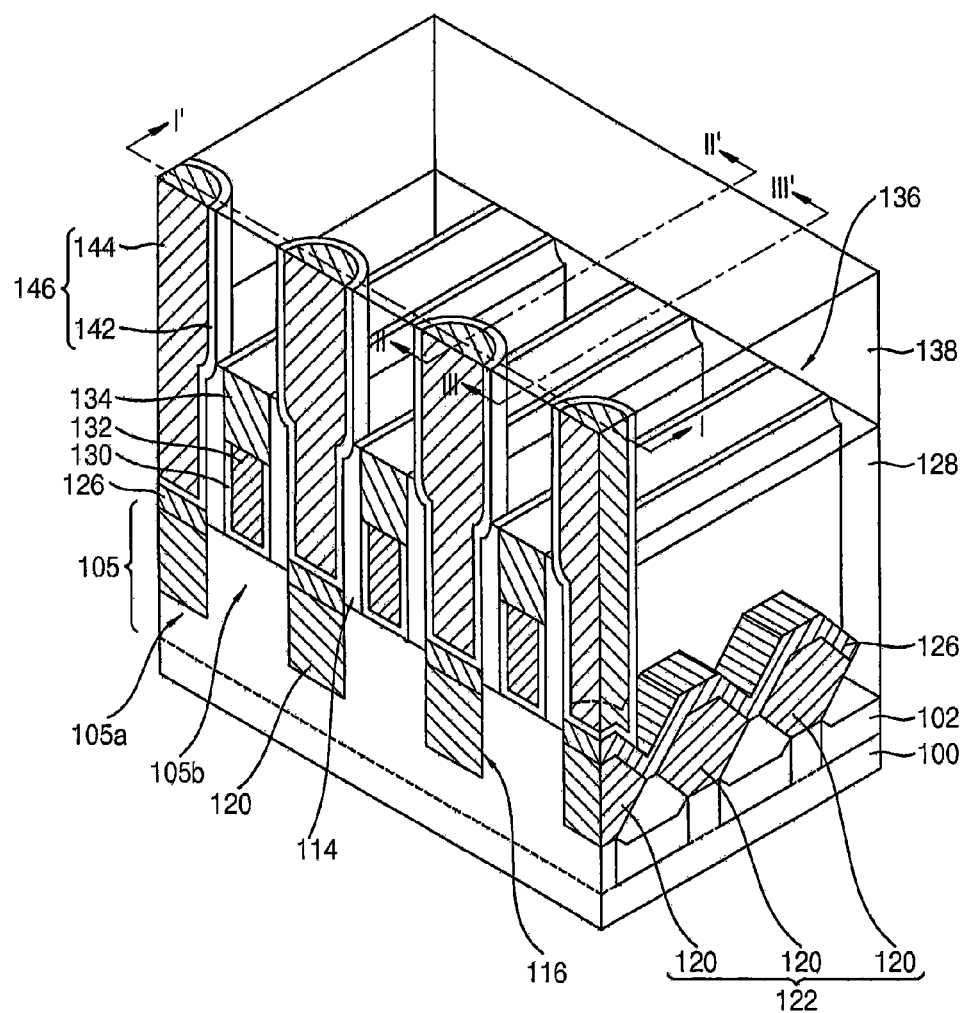
FIGS. 1 to 25 represent non-limiting, example embodiments as described herein.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
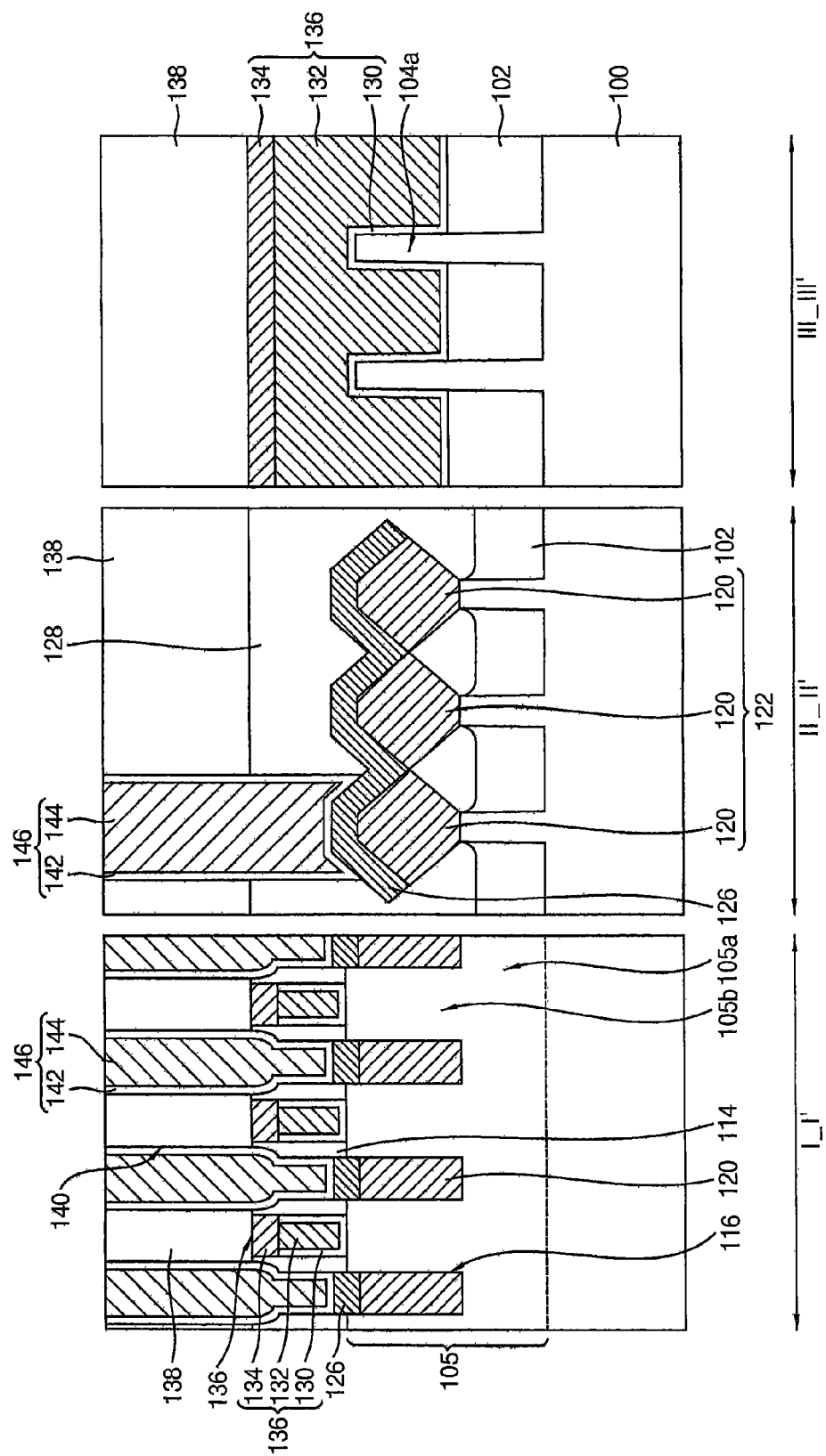

FIGS. 1 and 2 are a perspective view and a cross-sectional view, respectively, illustrating a semiconductor device including a FinFET in accordance with example embodiments. FIG. 2 includes cross-sectional views taken along lines I-I', II-II' and III-III', respectively, in FIG. 1.

Referring to FIGS. 1 and 2, the semiconductor device may include a substrate 100, an active fin structure 105, a gate structure 136, an epitaxial layer structure 122, a metal silicide pattern 126 and a contact structure 146. In some embodiments, the metal silicide pattern 126 (or a layer that is patterned to form the metal silicide pattern 126) may be referred to as a "silicide layer" or a "metal silicide layer." The semiconductor device may further include an isolation layer 102 and spacers 114.

The substrate 100 may include a semiconductor material, e.g., silicon. In some embodiments, the substrate 100 may be a silicon-on-insulator (SOI) substrate or a germanium-on-insulator (GOI) substrate, etc. The substrate 100 may have crystallinity, such as single crystallinity.

The active fin structure 105 may include a first pattern 105a extending in a first direction and a second pattern 105b protruding upwardly from a top surface of the first pattern 105a. The active fin structure 105 may include a material substantially the same as that of the substrate 100. In example embodiments, a plurality of active fin structures 105 may be arranged in a second direction substantially perpendicular to the first direction.

A lower portion of the second pattern 105b may be covered by the isolation layer 102, and an upper portion thereof may not be covered by the isolation layer 102. The upper portion of the second pattern 105b may serve as an active region, and thus may be referred to as an active fin 104a. That is, the active fin 104a may be disposed to be higher than a top surface of the isolation layer 102 under the gate structure 136.

In example embodiments, a plurality of second patterns 105b may be formed in the first direction, and a recess 116 may be formed between the plurality of second patterns 105b in the first direction. A bottom of the recess 116 may be lower than the top surface of the isolation layer 102 under the gate structure 136.

In example embodiments, the active fin 104a may have a pillar shape, and a length of the active fin 104a in the first direction may be greater/longer than a length thereof in the second direction. In example embodiments, a plurality of active fins 104a may be arranged both in the first and second directions, respectively.

The isolation layer 102 may include an oxide, e.g., silicon oxide.

In example embodiments, the gate structure 136 may extend in the second direction, and cover a top surface and a sidewall of the active fin 104a, and a plurality of gate structures 136 may be formed in the first direction.

In example embodiments, the gate structure 136 may include a gate insulation layer pattern 130, a gate electrode 132 and a hard mask 134 sequentially stacked on the active fin 104a and the isolation layer 102.

The gate insulation layer pattern 130 may include an oxide, e.g., silicon oxide, or a metal oxide having a high dielectric constant, e.g., hafnium oxide, tantalum oxide, zirconium oxide, etc. In one example, the gate insulation layer pattern 130 may include a silicon oxide layer and a metal oxide layer sequentially stacked.

The gate electrode 132 may include a material having a low resistance, e.g., a metal such as aluminum, copper, tantalum, etc., or a metal nitride thereof. Alternatively, the gate electrode 132 may include, e.g., polysilicon. The hard mask 134 may include a nitride, e.g., silicon nitride.

The spacers 114 may be formed on sidewalls of the gate structure 136, and may include a nitride, e.g., silicon nitride, silicon oxycarbonitride (SiOCN), etc.

An epitaxial layer pattern 120 may be formed in the recess 116 on a portion of the active fin 104a between the gate structures 136. The epitaxial layer pattern 120 may protrude from the portion of the active fin 104a in the recess 116 in a direction that is perpendicular to the first and second directions. In other words, the epitaxial layer pattern 120 may upwardly protrude. The epitaxial layer pattern 120 may also protrude in the second direction (e.g., laterally). In example embodiments, the epitaxial layer pattern 120 may have a cross-section taken along the second direction of which a shape may be pentagon, hexagon, or rhombus.

In example embodiments, a plurality of epitaxial layer patterns 120 disposed in the second direction may be connected to each other to be merged into a single layer pattern, which may be referred to as the epitaxial layer structure 122, according as the epitaxial layer patterns 120 may protrude in the second direction. Alternatively, the epitaxial layer patterns 120 disposed in the second direction may be spaced apart from each other by a very small distance.

The epitaxial layer pattern 120 and/or the epitaxial layer structure 122 may serve as a source/drain region of the FinFET, and may be doped with impurities.

In example embodiments, the epitaxial layer pattern 120 may include silicon or silicon germanium. When the FinFET is a negative-channel metal oxide semiconductor (NMOS) transistor, the epitaxial layer pattern 120 may include silicon doped with n-type impurities. When the FinFET has a positive-channel metal oxide semiconductor (PMOS) transistor, the epitaxial layer pattern 120 may include silicon germanium doped with p-type impurities.

The metal silicide pattern 126 may directly contact the epitaxial layer pattern 120 and/or the epitaxial layer structure 122, and cover an entire upper surface of the epitaxial layer pattern 120 and/or the epitaxial layer structure 122. In example embodiments, the metal silicide pattern 126 may be conformally formed on the epitaxial layer structure 122 and/or the epitaxial layer pattern 120. The metal silicide pattern 126 may be formed adjacent to sidewalls of the gate structures 136, and may extend in the second direction. In some embodiments, the metal silicide pattern 126 may be formed by a "blanket silicide" process, which may include forming a silicide layer on the entire upper/top surface of the epitaxial layer structure 122, rather than forming the silicide layer only on a portion of the epitaxial layer structure 122 that will be overlapped by the contact structure 146. As a result, the contact structure 146, according to various embodiments described herein, may overlap only a portion of the metal silicide pattern 126.

In example embodiments, when the plurality of epitaxial layer patterns 120 disposed in the second direction contact each other, the epitaxial layer patterns 120 may be electrically connected to each other. Alternatively, when the epitaxial layer patterns 120 disposed in the second direction are spaced apart from each other, the metal silicide pattern 126 may be formed on the epitaxial layer patterns 120 and a gap between the epitaxial layer patterns 120. Thus, the epitaxial layer patterns 120 disposed in the second direction by a very small distance may be electrically connected to each other via the metal silicide pattern 126.

The metal silicide pattern 126 may include, e.g., cobalt silicide, nickel silicide, titanium silicide, tantalum silicide, molybdenum silicide, tungsten silicide, etc.

Insulating interlayers 128 and 138 may cover the gate structures 136 and the metal silicide pattern 126. In example embodiments, a plurality of insulating interlayers 128 and 138 may be stacked on the substrate 100. In one example, a first insulating interlayer 128 may fill a gap between the gate structures 136, and a second insulating interlayer 138 may be formed on the first insulating interlayer 128. The first and second insulating interlayers 128 and 138 may include substantially the same material, e.g., silicon oxide.

The contact structure 146 may be formed through the first and second insulating interlayers 128 and 138, and may contact a first upper surface of the metal silicide pattern 126, and a second upper surface of the metal silicide pattern 126 may not contact the contact structure 146. An area of the first upper surface of the metal silicide pattern 126 (which first upper surface contacts the contact structure 146) may be smaller than the area of an entire upper surface of the metal silicide pattern 126 on the epitaxial layer structure 122. In example embodiments, the area of the first upper surface of the metal silicide pattern 126 may be equal to or less than about 50% of the area of the entire upper surface of the metal silicide pattern 126 on the epitaxial layer structure 122. The upper surface of the metal silicide pattern 126 may not be flat, and thus a lower surface of the contact structure 146 may not be flat.

In example embodiments, a plurality of contact structures 146 may be formed in the first direction, and only one of the contact structures 146 may be formed on the metal silicide pattern 126 on each of the epitaxial layer structures 122. Alternatively, ones of the plurality of contact structures 146 may be formed on the metal silicide pattern 126 on each of the epitaxial layer structures 122.

The contact structure 146 may include a barrier layer pattern 142 and a metal layer pattern 144 sequentially stacked. The barrier layer pattern 142 may be formed on a sidewall and a bottom of a contact hole 140 through the first and second insulating interlayers 128 and 138, and may directly contact the metal silicide pattern 126. The metal layer pattern 144 may be formed on the barrier layer pattern 142, and may fill a remaining portion of the contact hole 140. The barrier layer pattern 142 may include, e.g., titanium, titanium nitride, tungsten nitride, tantalum, tantalum nitride, TiAlC, cobalt, ruthenium, nickel, etc. The barrier layer pattern 142 may have a single layer structure or a multi-layered structure. The metal layer pattern 144 may include, e.g., tungsten, copper, aluminum, etc.

An electrical signal may be applied to the metal silicide pattern 126 having a lower resistance and the epitaxial layer structure 122 thereunder via the contact structure 146. Thus, the electrical signal may be rapidly transferred to the source/drain region due to the metal silicide pattern 126.

A conductive pattern may be further formed on the contact structure 146. In example embodiments, the conductive pattern may include, e.g., a pad electrode, a conductive line, etc.

As described above, the semiconductor device may include the metal silicide pattern 126 on the entire upper surface of the epitaxial layer pattern 120 and/or the epitaxial layer structure 122 serving as the source/drain region of the FinFET, so that a contact resistance of source/drain region may decrease. Also, portions of (e.g., a percentage of) the contact structure 146 and the gate structure 136 facing each other may decrease, so that a parasitic capacitance may be reduced.

FIGS. 3 to 12 are cross-sectional views and a perspective view illustrating stages of a method of manufacturing a semiconductor device in accordance with example embodiments.

Figure 6:
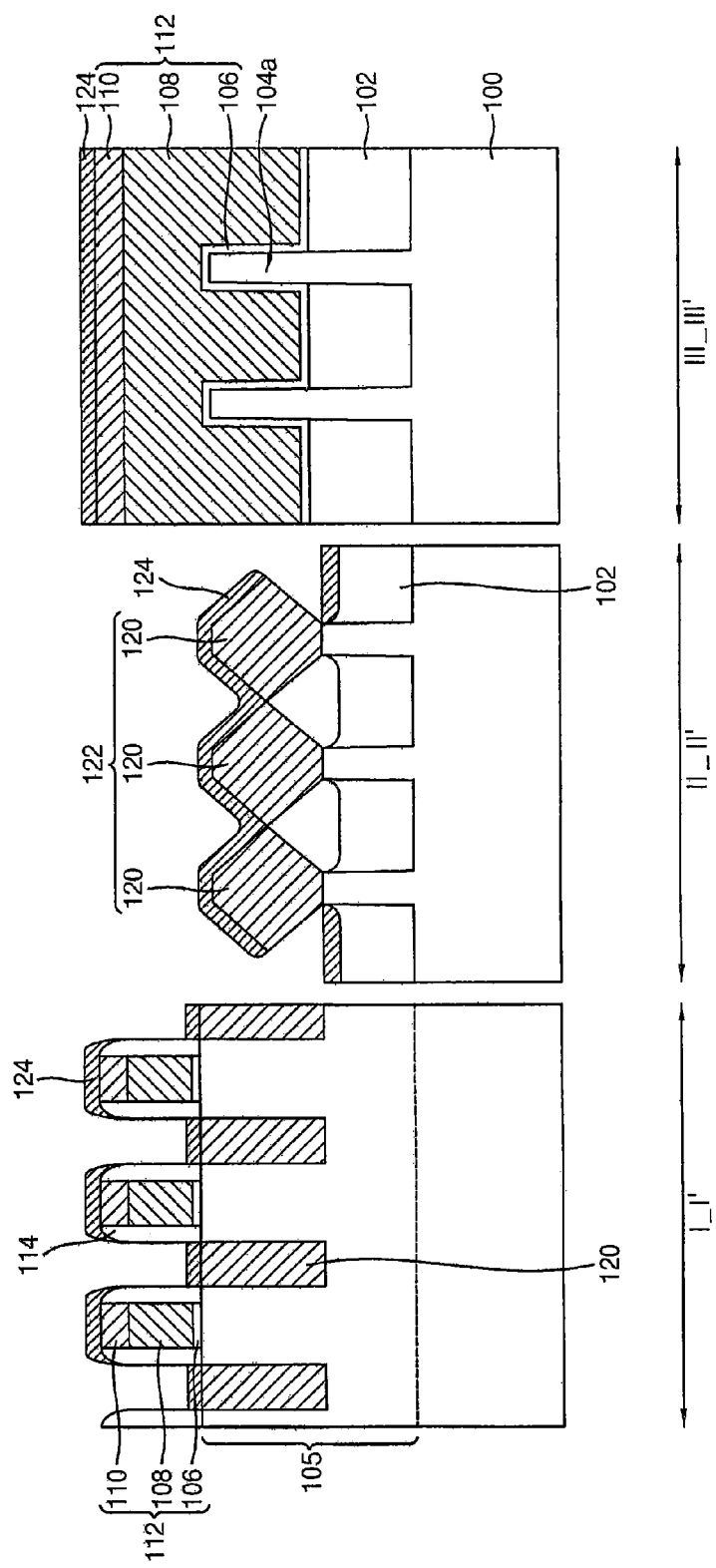
Figure 7:
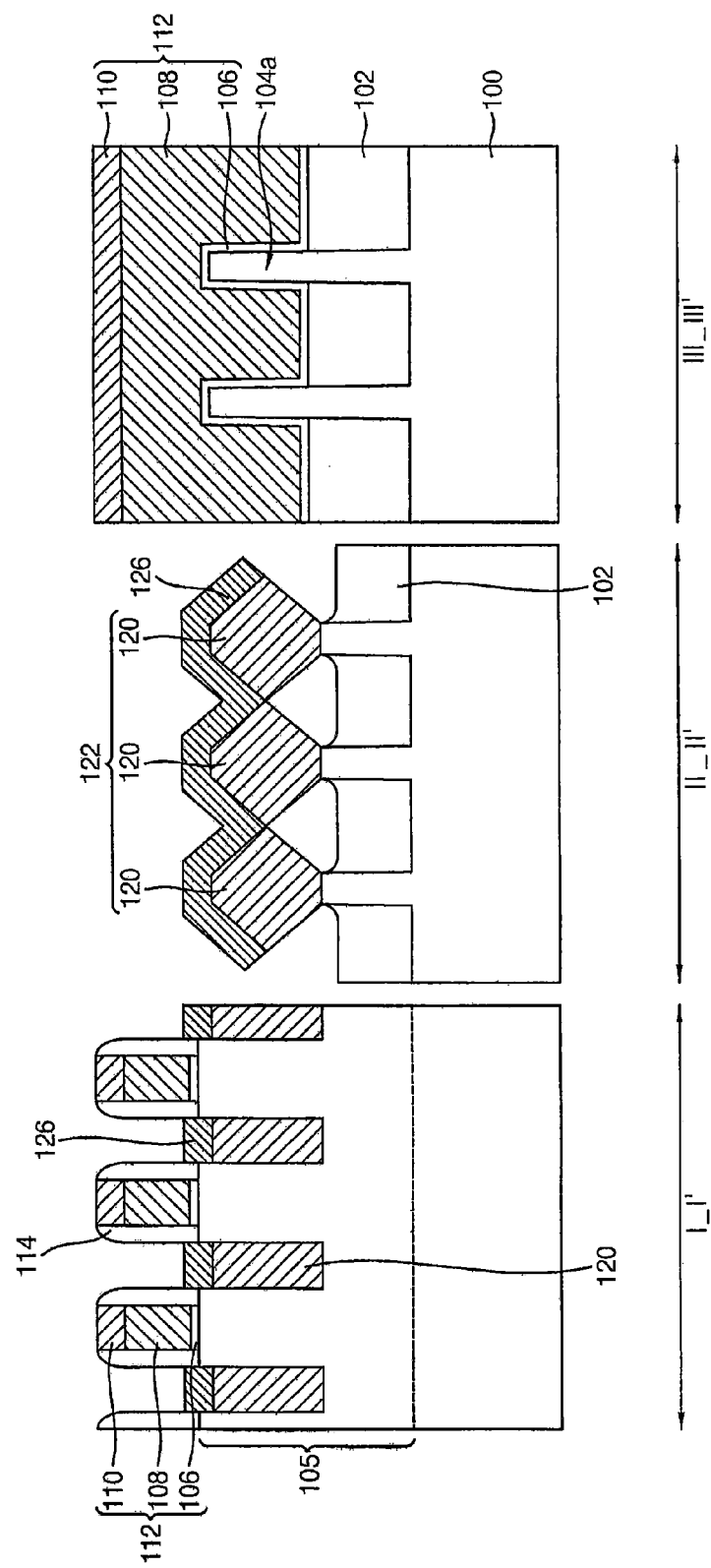
Figure 8:
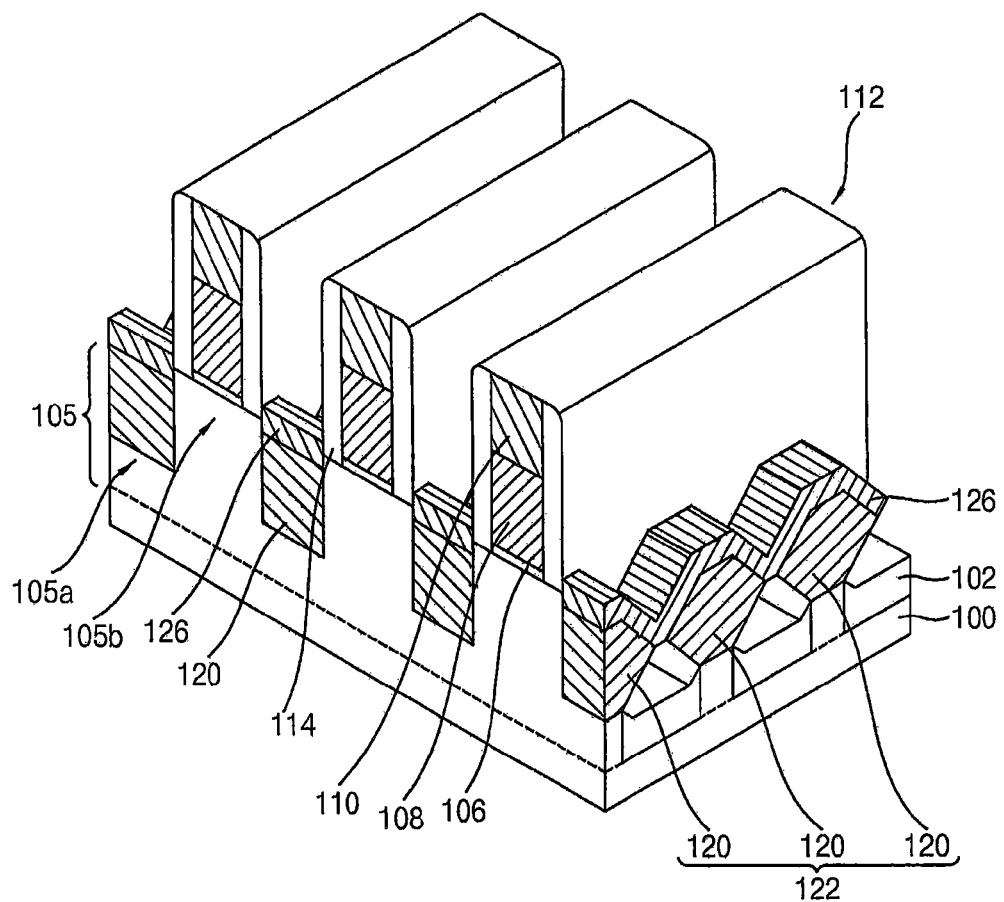

Particularly, each of FIGS. 3 to 7 and 9 to 12 includes cross-sectional views taken along lines I-I', II-II' and III-III' of FIG. 1, respectively, and FIG. 8 is a perspective view illustrating a metal silicide pattern on an epitaxial layer structure.

Figure 3:
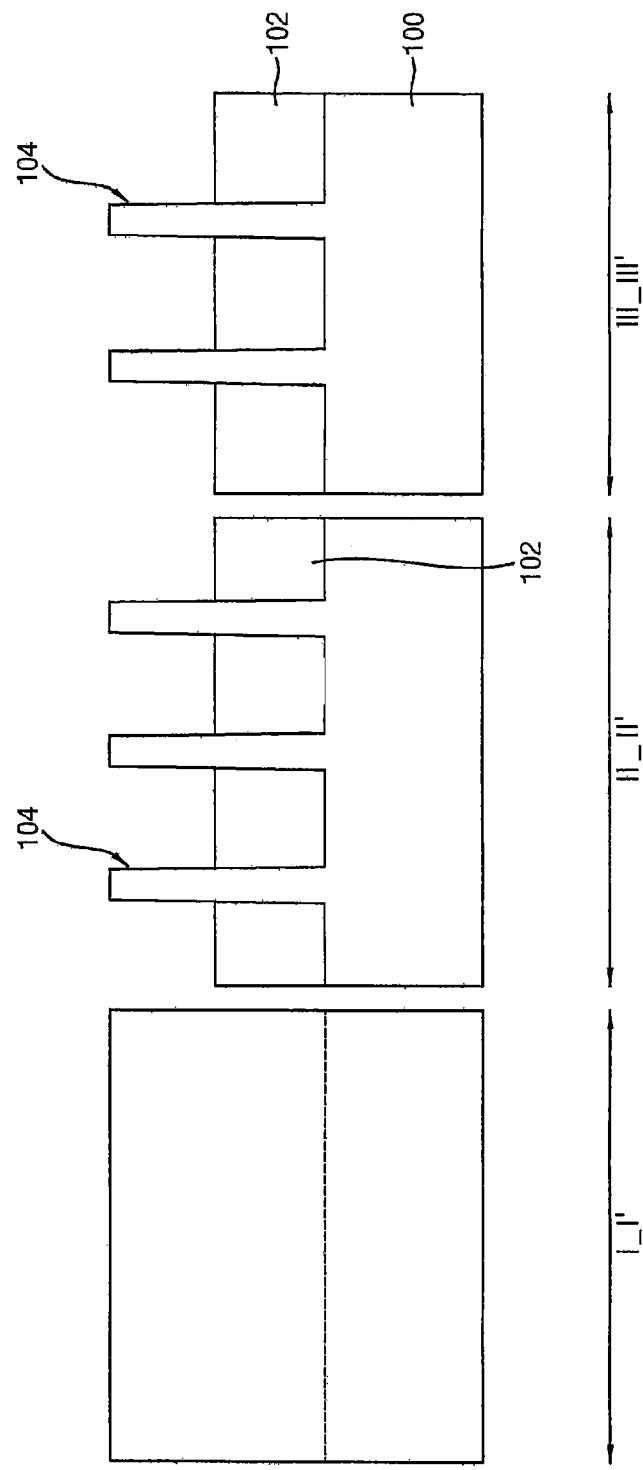

Referring to FIG. 3, an upper portion of a substrate 100 may be partially removed to form a trench extending in a first direction, and an isolation layer 102 may be formed on the substrate 100 to fill a lower portion of the trench.

Before forming the trench, impurities may be implanted into the substrate 100 to form a well region.

In example embodiments, the isolation layer 102 may be formed by forming an insulation layer on the substrate 100 to sufficiently fill the trench, planarizing the insulation layer until a top surface of the substrate 100 may be exposed, and removing an upper portion of the insulation layer to expose an upper portion of the trench. The insulation layer may be formed to include an oxide, e.g., silicon oxide.

Accordingly, as the isolation layer 102 is formed, a plurality of preliminary active fins 104 may be formed on the substrate 100 to extend in the first direction. In example embodiments, the active fins 104 may be arranged in a second direction substantially perpendicular to the first direction.

Figure 4:
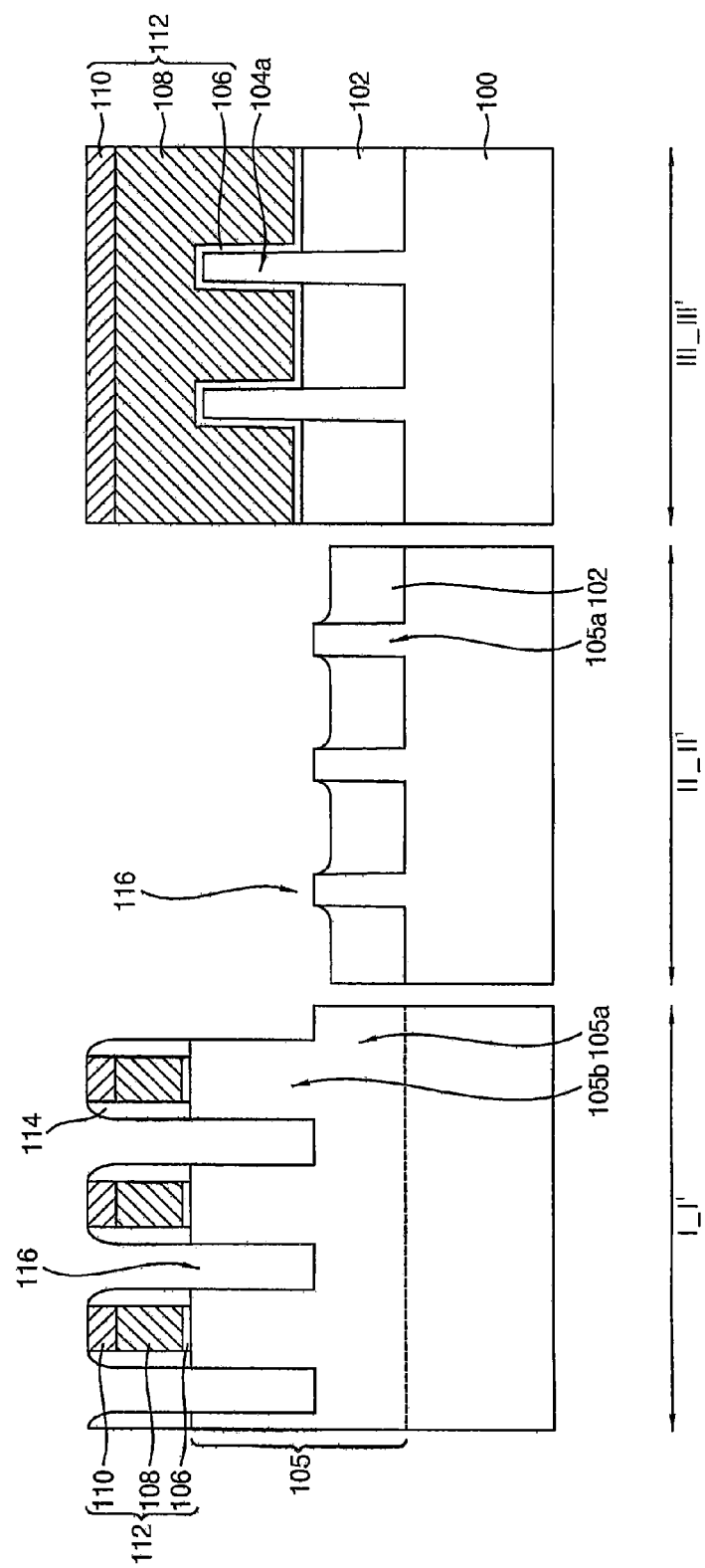

Referring to FIG. 4, a plurality of dummy gate structures 112 may be formed on the substrate 100. Spacers 114 may be formed on sidewalls of each of the dummy gate structures 112. An upper portion of the preliminary active fins 104 may be etched to form a recess 116 between the spacers 114.

Particularly, the dummy gate structures 112 may be formed by sequentially stacking a dummy insulation layer, a dummy gate electrode layer and a hard mask layer on the preliminary active fins 104 and the isolation layer 102, patterning the hard mask layer by a photolithography process using a photoresist pattern to form a hard mask 110, and sequentially etching the dummy gate electrode layer and the dummy insulation layer using the hard mask 110 as an etching mask. Thus, each of the dummy gate structures 112 may be formed to include a dummy insulation layer pattern 106, a dummy gate electrode 108 and the hard mask 110 sequentially stacked.

The dummy insulation layer may be formed to include an oxide, e.g., silicon oxide, the dummy gate electrode layer may be formed to include, e.g., polysilicon, and the hard mask layer may be formed to include a nitride, e.g., silicon nitride. The dummy insulation layer may be formed by a chemical vapor deposition (CVD) process, an atomic layer deposition (ALD) process, etc. Alternatively, the dummy insulation layer may be formed by a thermal oxidation process on an upper portion of the substrate 100. The dummy gate electrode layer and the hard mask layer may be also formed by a CVD process, an ALD process, etc.

In example embodiments, each of the dummy gate structures 112 may be formed to extend in the second direction on the preliminary active fins 104 and the isolation layer 102, and the plurality of dummy gate structures 112 may be formed at a given distance from each other in the first direction.

A spacer layer may be formed on the dummy gate structures 112, the preliminary active fins 104 and the isolation layer 102. The spacer layer may be anisotropically etched to form the spacers 114 on both sidewalls of each of the dummy gate structures 112.

The preliminary active fin 104 may be partially removed using the dummy gate structures 112 and the spacers 114 as an etch mask to form the recess 116. Thus, an active fin structure 105 may be formed to include a first pattern 105*a* extending in the first direction and a second pattern 105*b* protruding from a top surface of the first pattern 105*a*. The second pattern 105*b* may include a portion higher than an upper surface of the isolation layer 102 under the dummy gate structures 112, which may serve as an active fin 104*a*.

In example embodiments, a bottom of the recess 116 may be lower than an upper surface of the isolation layer 102 under the dummy gate structures 112.

In example embodiments, the etching processes for forming the spacers 114 and the recess 116 may be performed in-situ.

Figure 5:
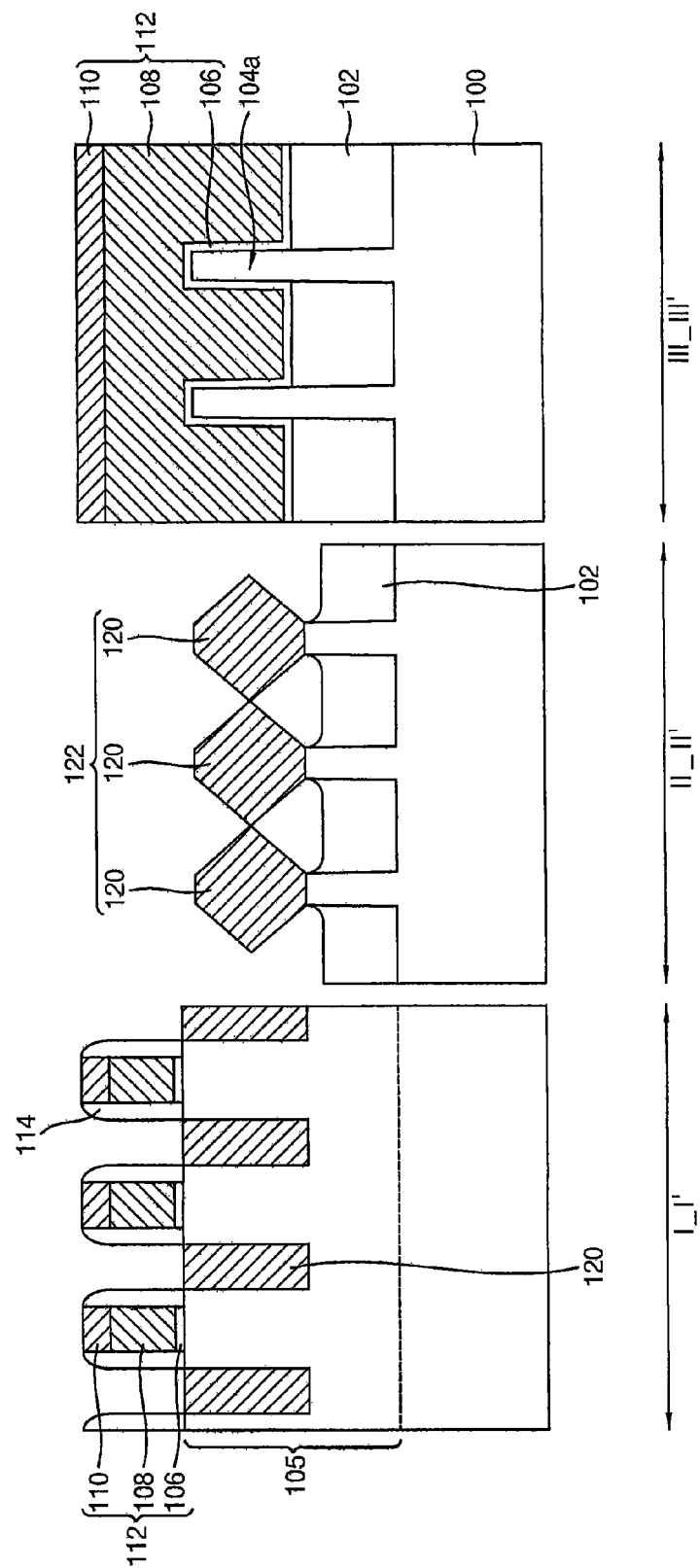

Referring to FIG. 5, an epitaxial layer pattern 120 may be formed to fill the recess 116. In example embodiments, a plurality of epitaxial layer patterns 120 may be formed in the second direction. Sidewalls of the epitaxial layer patterns 120 in the second direction may contact each other to be merged into a single layer, which may referred to as an epitaxial layer structure 122.

In example embodiments, a selective epitaxial growth (SEG) process may be performed using a surface portion of the active fin structure 105 exposed by the recess 106 as a seed to form the epitaxial layer patterns 120.

The epitaxial layer patterns 120 may be grown not only in a vertical direction but also in a horizontal direction, and thus each of the epitaxial layer patterns 120 may be formed to have a cross-section taken along the second direction of which a shape may be pentagon, hexagon, or rhombus. In example embodiments, the plurality of epitaxial layer patterns 120 formed in the second direction may be grown to be merged into a single layer, and thus the plurality of epitaxial layer patterns 120 may contact each other.

In example embodiments, when the SEG process is performed, impurities may be doped in-situ into the epitaxial layer patterns 120. Thus, the epitaxial layer structure 122 including the epitaxial layer patterns 120 may serve as a source/drain region of a FinFET.

In example embodiments, each of the epitaxial layer patterns 120 may be formed to include silicon or silicon germanium. When a PMOS transistor is formed, the epitaxial layer patterns 120 may be formed to include silicon germanium, and may be doped with p-type impurities. Alternatively, when an NMOS transistor is formed, the epitaxial layer patterns 120 may be formed to include silicon, and may be doped with n-type impurities.

In example embodiments, after performing the SEG process, impurities may be further implanted into the active fin structure 105, and the substrate 100 may be annealed.

Referring to FIG. 6, a metal layer 124 may be formed cm the dummy gate structures 112, the epitaxial layer structure 122 and the isolation layer 102.

The metal layer 124 may be formed by a physical vapor deposition (PVD) process. In this case, the metal layer 124 may be formed on top surfaces of the dummy gate structures 112, the epitaxial layer structure 122 and the isolation layer 102. The metal layer 124 may be formed to include, e.g., cobalt, titanium, tantalum, molybdenum, nickel, tungsten, etc.

Referring to FIGS. 7 and 8, the metal layer 124 and the epitaxial layer structure 122 may be reacted with each other by an annealing process to form a metal silicide pattern 126 on the epitaxial layer structure 122, which may be referred to as a silicidation process. The metal silicide pattern 126 may directly contact the epitaxial layer structure 122, and may cover an upper surface of the epitaxial layer structure 122. That is, the metal silicide pattern 126 may be formed adjacent to sidewalls of the dummy gate structures 112, and may extend in the second direction. However, other portions of the metal layer 124 except for the portion thereof on the epitaxial layer structure 122 may not be reacted.

In the silicidation reaction for forming the metal silicide pattern 126, a surface of the epitaxial layer structure 122 may be consumed, and thus the epitaxial layer patterns 120 of the epitaxial layer structure 122 may be spaced apart from each other by a very small distance. In this case, the metal silicide pattern 126 may be formed on the epitaxial layer patterns 120 and a gap between the epitaxial layer patterns 120.

Thus, the epitaxial layer patterns 122 in the second direction may directly contact each other to be electrically connected to each other. Alternatively, the epitaxial layer patterns 122 in the second direction may be electrically connected to each other via the metal silicide pattern 126.

The metal silicide pattern 126 may include the metal of the metal layer 124. The metal silicide pattern 126 may be formed to include, e.g., cobalt silicide, nickel silicide, titanium silicide, tantalum silicide, molybdenum silicide, tungsten silicide, etc.

The metal layer 124 on the dummy gate structures 112 and the isolation layer 102 may be removed. In example embodiments, an etch stop layer may be further formed on the dummy gate structures 112, the spacers 114, the epitaxial layer structure 122, the metal silicide pattern 126 and the isolation layer 102.

Figure 9:
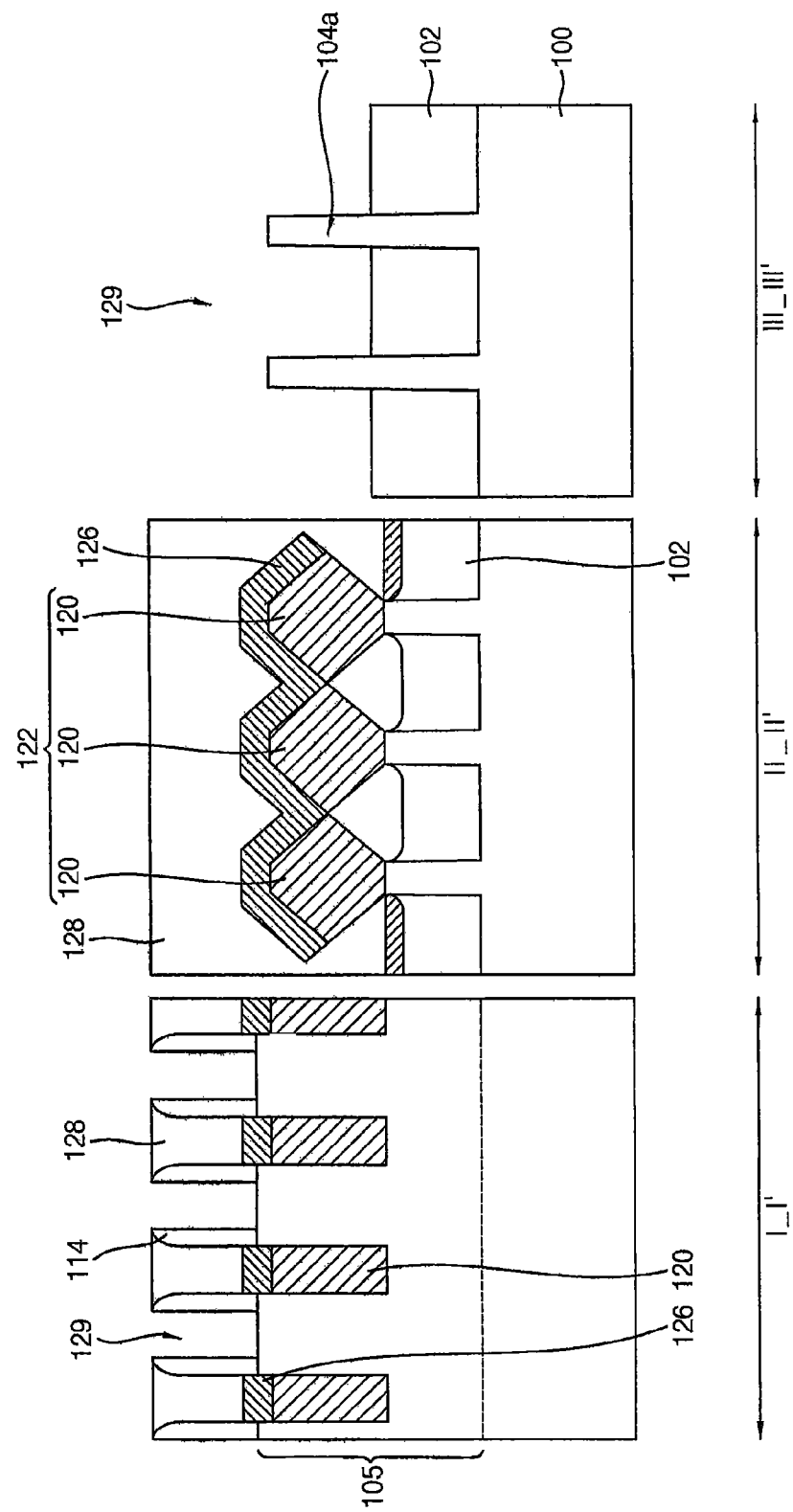

Referring to FIG. 9, a first insulating interlayer 128 covering the dummy gate structures 112, the spacers 114, the epitaxial layer structure 122, the metal silicide pattern 126 and the isolation layer 102 may be formed on the substrate 100, and an upper portion of the first insulating interlayer 128 may be planarized until top surfaces of the dummy gate structures 112 may be exposed. The first insulating interlayer 128 may be formed to include, e.g., silicon oxide. In example embodiments, the planarization process may be performed by a chemical mechanical polishing (CMP) process and/or an etch back process.

The exposed dummy gate structures 112 may be removed to form openings 129 exposing top surfaces of the active fin 104a and the isolation layer 102. In example embodiments, the exposed top surface of the active fin 104a may be, e.g., thermally oxidized to form a thermal oxide layer.

Figure 10:
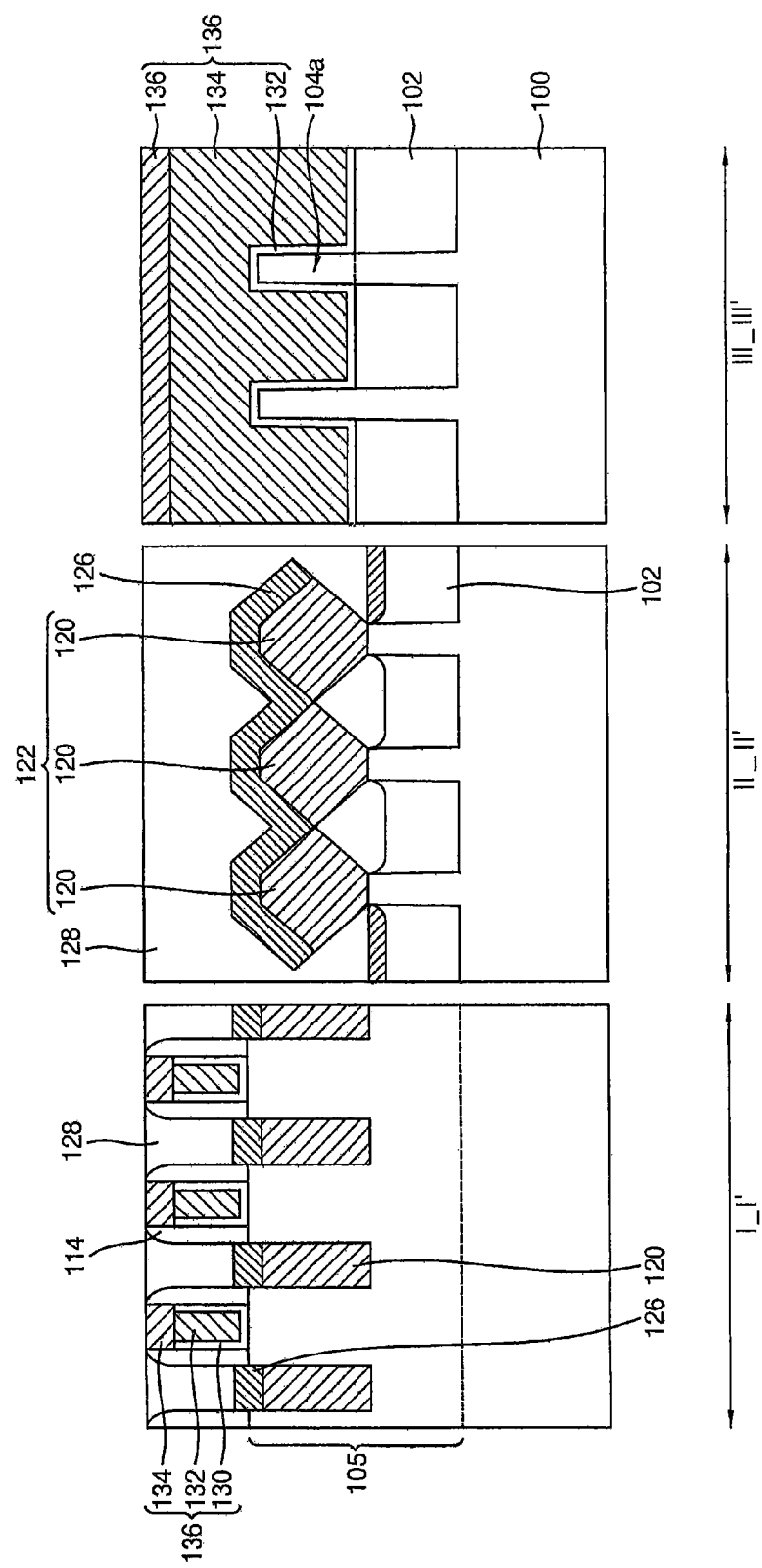

Referring to FIG. 10, a gate structure 136 may be formed to fill each of the openings 129. The gate structure 136 may include a gate insulation layer pattern 130, a gate electrode 132 and a hard mask 134 sequentially stacked.

Particularly, a high-k dielectric layer may be formed on top surfaces of the thermal oxide layer and the isolation layer 102, sidewalls of the openings 129, and a top surface of the first insulating interlayer 128, and a gate electrode layer may be formed on the high-k dielectric layer to fill remaining portions of the openings 129.

The high-k dielectric layer may be formed to include a metal oxide having a high dielectric constant, e.g., hafnium oxide, tantalum oxide, zirconium oxide, etc. The gate electrode layer may be formed to include a material having a low resistance, e.g., a metal such as aluminum, copper, tantalum, etc., or a metal nitride thereof by an ALD process, a physical vapor deposition (PVD) process, etc.

The gate electrode layer and the high-k dielectric layer may be planarized until the top surface of the first insulating interlayer 128 may be exposed, and the gate electrode layer filling each of the openings 129 may be partially etched to form the gate insulation layer pattern 130 on the top surfaces of the thermal oxide layer and the isolation layer 102, and the sidewalls of the openings 129, and the gate electrode 132 filling a lower portion of each of the openings 129 on the gate insulation layer pattern 130. In example embodiments, the planarization process may be performed by a CMP process and/or an etch back process. A hard mask layer may be formed on the gate electrode 132 and the gate insulation layer pattern 130 to fill a remaining portion of each of the openings 129, and the hard mask layer may be planarized until the top surface of the first insulating interlayer 128 may be exposed to form the hard mask 134.

Thus, the gate insulation layer pattern 130, the gate electrode 132 and the hard mask 134 sequentially stacked may form the gate structure 136.

Figure 11:
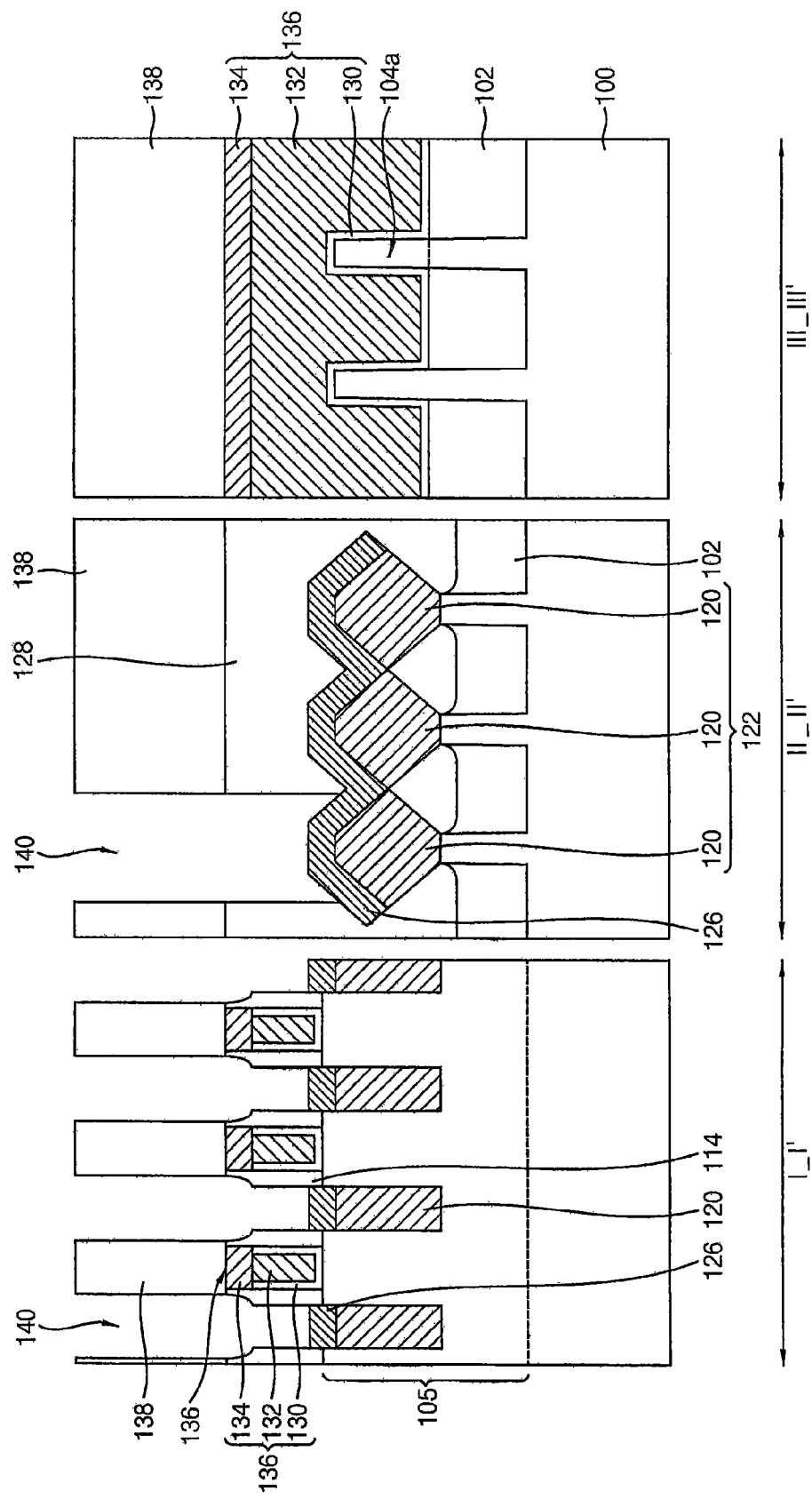

Referring to FIG. 11, a second insulating interlayer 138 may be formed on the first insulating interlayer 128. The second insulating interlayer 138 may be formed to include a material substantially the same as that of the first insulating interlayer 128.

The first and second insulating interlayers 128 and 138 may be etched to form a contact hole 140 partially exposing the upper surface (e.g., exposing only a first upper surface) of the metal silicide pattern 126. That is, the contact hole 140 may not expose the entire upper surface of the metal silicide pattern 126. In example embodiments, when the etch stop layer is formed on the metal silicide pattern 126, the etch stop layer exposed by the contact hole 140 may be also etched. Moreover, in some embodiments, a portion of the metal silicide pattern 126 may be etched (e.g., due to over-etching) when forming the contact hole 140. As a result, a first thickness of a first portion of the metal silicide pattern 126 underlying the contact structure 146, which is formed in the contact hole 140 (e.g., in FIG. 12), may be thinner than a second thickness of a second portion of the metal silicide pattern 126 underlying the first and second insulating interlayers 128 and 138.

In example embodiments, an area of the metal silicide pattern 126 exposed by the contact hole 140 may be equal to or less than about 50% of an area of the entire upper surface of the metal silicide pattern 126 on the epitaxial layer structure 122.

In example embodiments, a plurality of contact holes 140 may be formed in the first direction, and only one of the contact holes 140 may be formed on the metal silicide pattern 126 on each of the epitaxial layer structures 122. Alternatively, a plurality of contact holes 140 may be formed on the metal silicide pattern 126 on each of the epitaxial layer structures 122.

Figure 12:
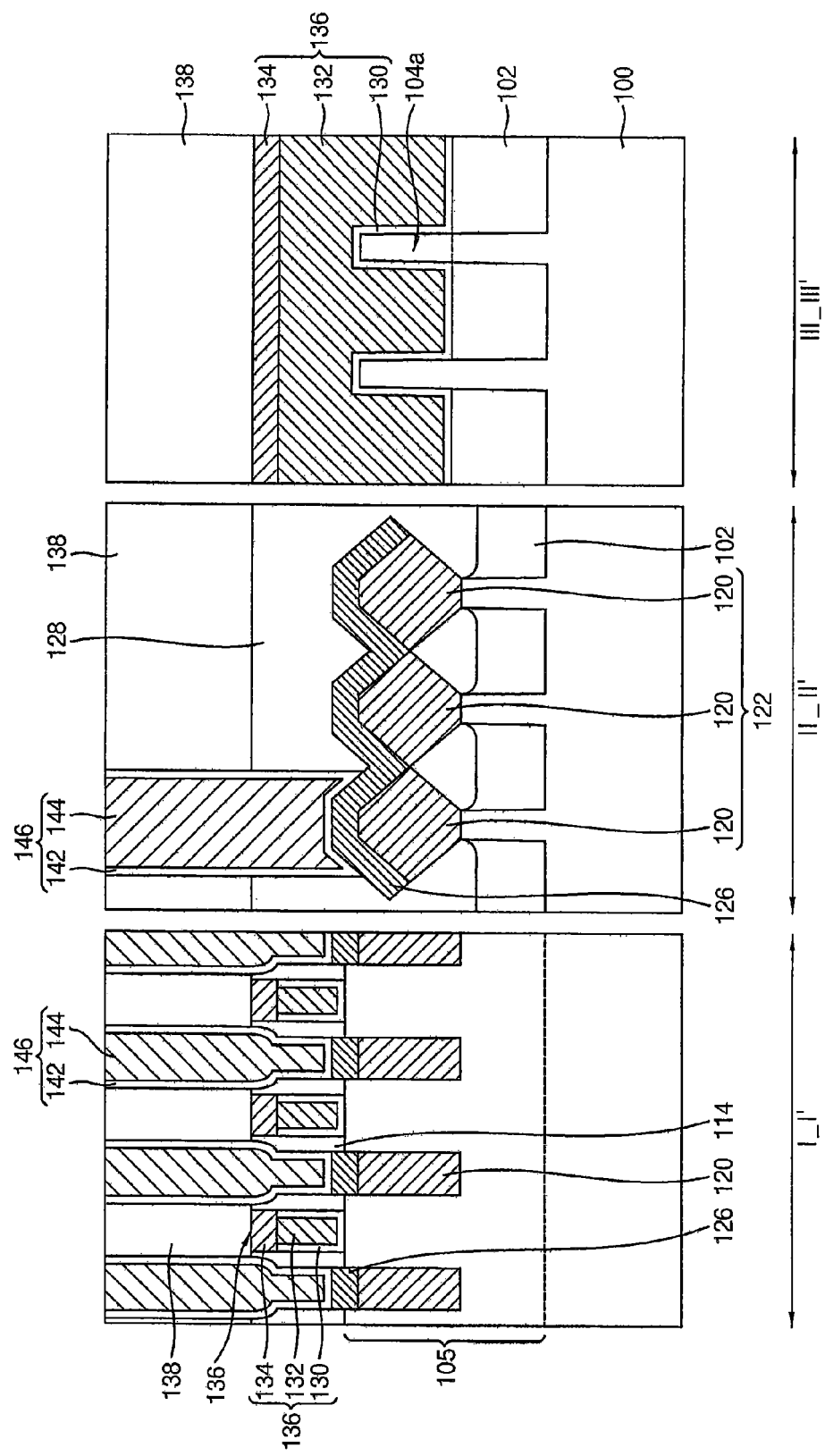

Referring to FIG. 12, a contact structure 146 may be formed to fill each of the contact holes 140.

Particularly, a barrier layer may be formed on a second insulating interlayer 138 and a sidewall and a bottom of each of the contact holes 140. The barrier layer may be formed to include, e.g., titanium, titanium nitride, tungsten nitride, tantalum, tantalum nitride, TiAlC, cobalt, ruthenium, nickel, etc. The barrier layer may be formed to have a single layer structure or a multi-layered structure.

A metal layer may be formed on the barrier layer to sufficiently fill remaining portions of the contact holes 140. The metal layer may be formed to include, e.g., tungsten, copper, aluminum, etc.

The metal layer and the barrier layer may be planarized until a surface of the second insulating interlayer 138 may be exposed to form the contact structure 146 including a barrier layer pattern 142 and a metal layer pattern 144 in each of the contact holes 140.

A conductive pattern may be further formed on the contact structures 146. In example embodiments, the conductive pattern may include, e.g., a pad electrode, a conductive line, etc.

As described above, the metal silicide pattern 126 may be formed on the entire upper surface of the epitaxial layer structure 122, so that a contact resistance of the source/drain region of the finFET may decrease. Also, portions (e.g., a percentage) of the contact structure 146 and the gate structure 136 facing each other may decrease, so that a parasitic capacitance may be reduced.

Figure 14:
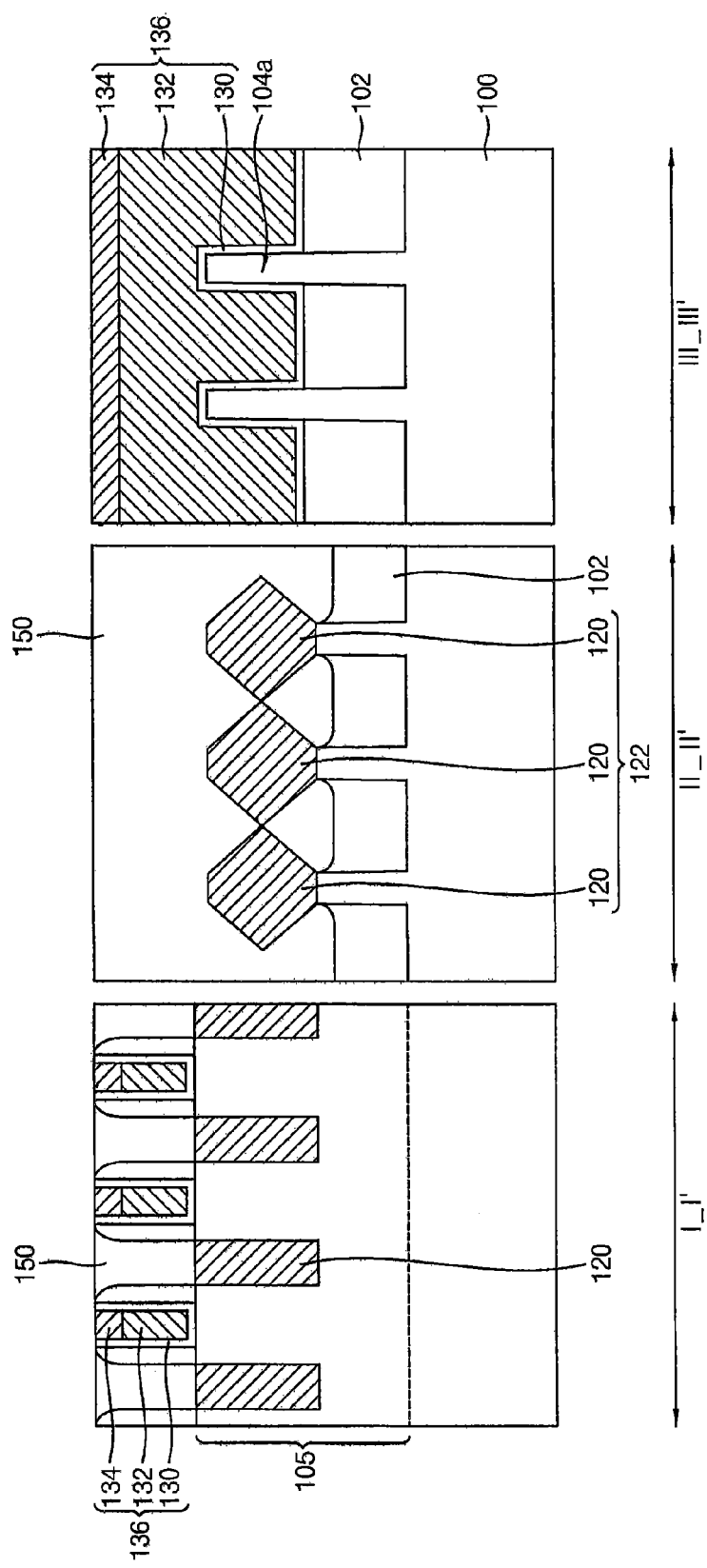
Figure 15:
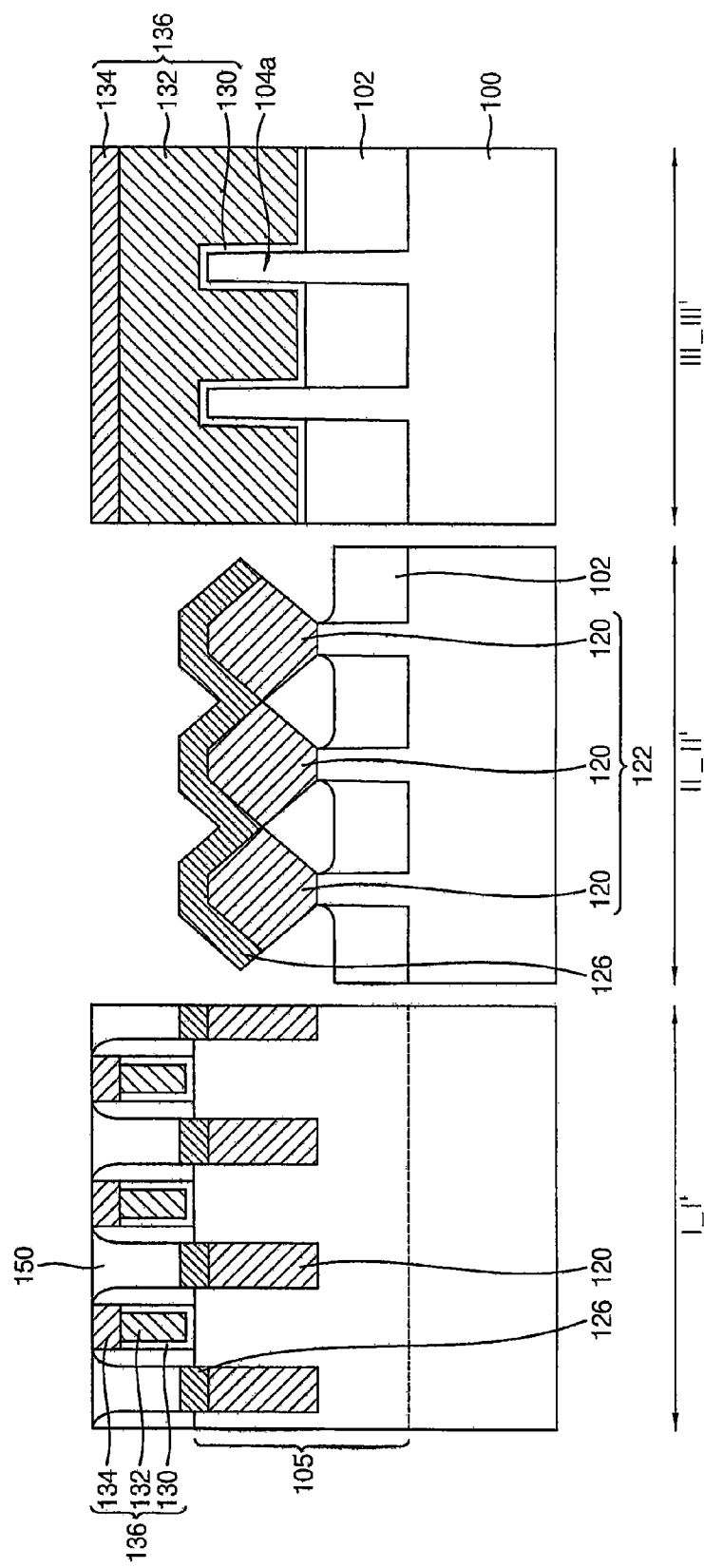
Figure 16:
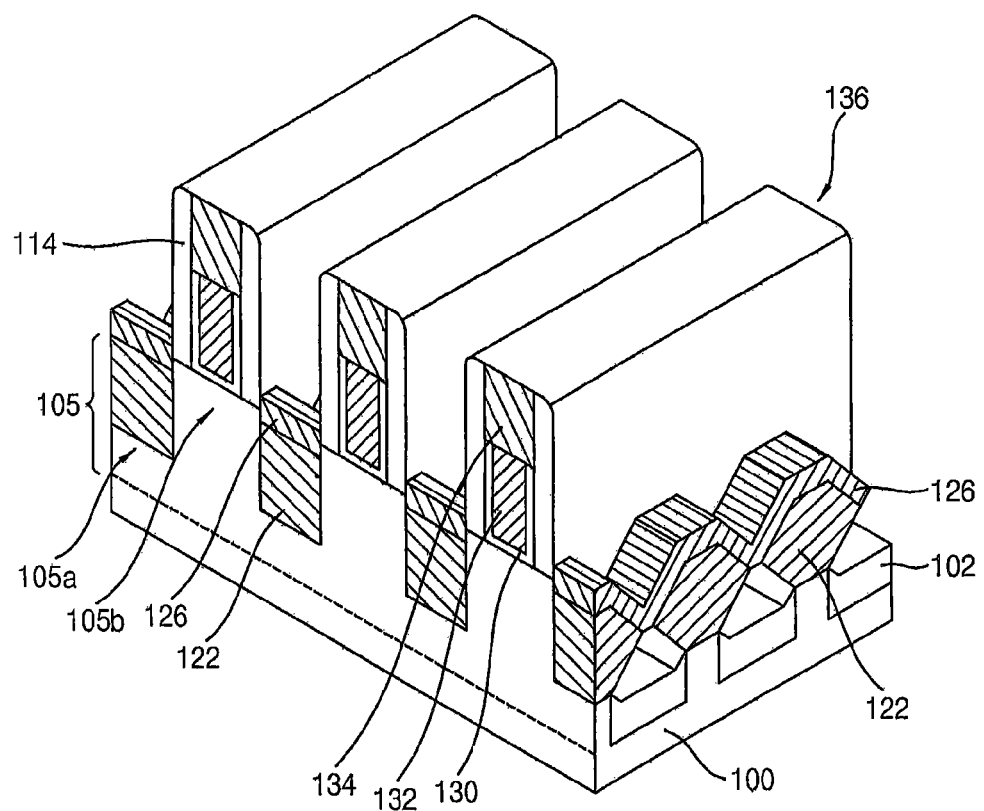

FIGS. 13 to 17 are cross-sectional views and a perspective view illustrating stages of a method of manufacturing a semiconductor device in accordance with example embodiments. Particularly, each of FIGS. 13 to 15 and 17 includes cross-sectional views of FIGS. 1 and 2, respectively, and FIG. 16 is a perspective view illustrating a metal silicide pattern on an epitaxial layer structure.

First, processes substantially the same as or similar to those illustrated with reference to FIGS. 3 to 5 may be performed.

Figure 13:
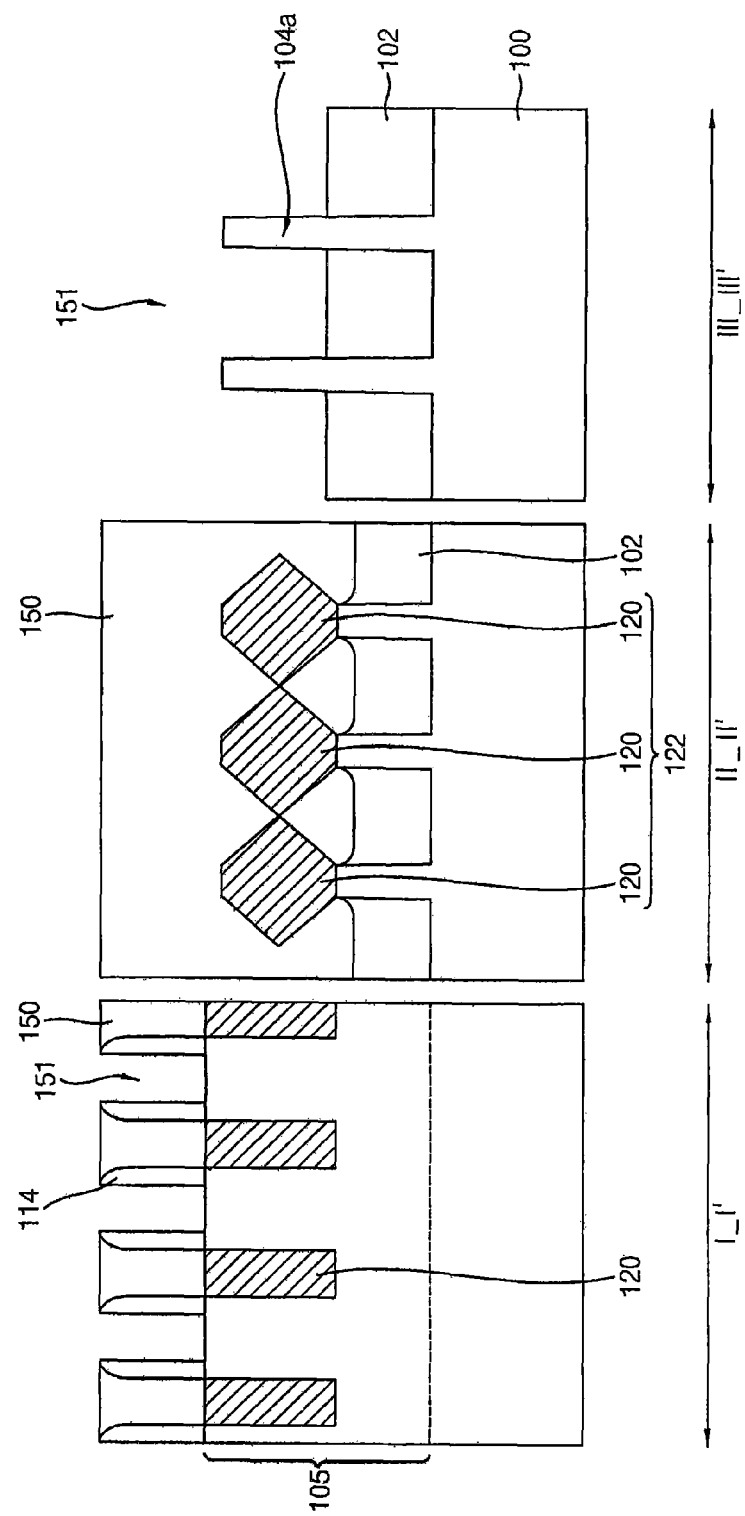

Referring to FIG. 13, a sacrificial insulation layer 150 covering the dummy gate structures 112, the spacers 114, the epitaxial layer structure 122 and the isolation layer 102 may be formed on the substrate 100, and an upper portion of the sacrificial insulation layer 150 may be planarized until a top surface of the dummy gate structure 112 may be exposed.

The sacrificial insulation layer 150 may be formed to include, e.g., silicon oxide. In example embodiments, the planarization process may be performed by a chemical mechanical polishing (CMP) process and/or an etch back process.

The exposed dummy gate structure 112 may be removed to form openings 151 exposing top surfaces of the active fin 104a and the isolation layer 102. In example embodiments, the exposed top surface of the active fin 104a may be, e.g., thermally oxidized to form a thermal oxide layer.

Referring to FIG. 14, a gate structure 136 may be formed to fill each of the openings 151. The gate structure 136 may include a gate insulation layer pattern 130, a gate electrode 132 and a hard mask 134 sequentially stacked.

In example embodiments, a process substantially the same as or similar to that illustrated with reference to FIG. 10 may be performed to form the gate structure 136. The gate insulation layer pattern 130 may be formed to include a metal oxide having a high dielectric constant, e.g., hafnium oxide, tantalum oxide, zirconium oxide, etc. The gate electrode 132 may be formed to include a material having a low resistance, e.g., a metal such as aluminum, copper, tantalum, etc., or a metal nitride thereof.

Referring to FIGS. 15 and 16, the sacrificial insulation layer 150 may be removed, so that the epitaxial layer structure 122, the gate structure 136 and the isolation layer 102 may be exposed. A metal silicide pattern 126 may be formed on the epitaxial layer structure 122.

Particularly, a metal layer may be formed on the gate structures 136, the epitaxial layer structure 122 and the isolation layer 102. The metal layer may be formed by a physical vapor deposition (PVD) process. In this case, the metal layer may be formed on top surfaces of the gate structures 136, the epitaxial layer structure 122 and the isolation layer 102. The metal layer may be formed to include, e.g., cobalt, titanium, tantalum, molybdenum, nickel, tungsten, etc.

The metal layer and the epitaxial layer structure 122 may be reacted with each other by an annealing process to form a metal silicide pattern 126 on the epitaxial layer structure 122. The metal silicide pattern 126 may directly contact the epitaxial layer structure 122, and may cover an upper surface of the epitaxial layer structure 122. That is, the metal silicide pattern 126 may be formed adjacent to sidewalls of the gate structures 112, and may extend in the second direction. However, other portions of the metal layer except for the portion thereof on the epitaxial layer structure 122 may not be reacted. The non-reacted metal layer may be removed.

The metal silicide pattern 126 may include the metal of the metal layer 124. The metal silicide pattern 126 may be formed to include, e.g., cobalt silicide, nickel silicide, titanium silicide, tantalum silicide, molybdenum silicide, tungsten silicide, etc.

As described above, first, the gate structure 136 may be formed on the substrate 100, and then the silicide pattern 126 may be formed adjacent to sidewalls of the gate structures 136.

Figure 17:
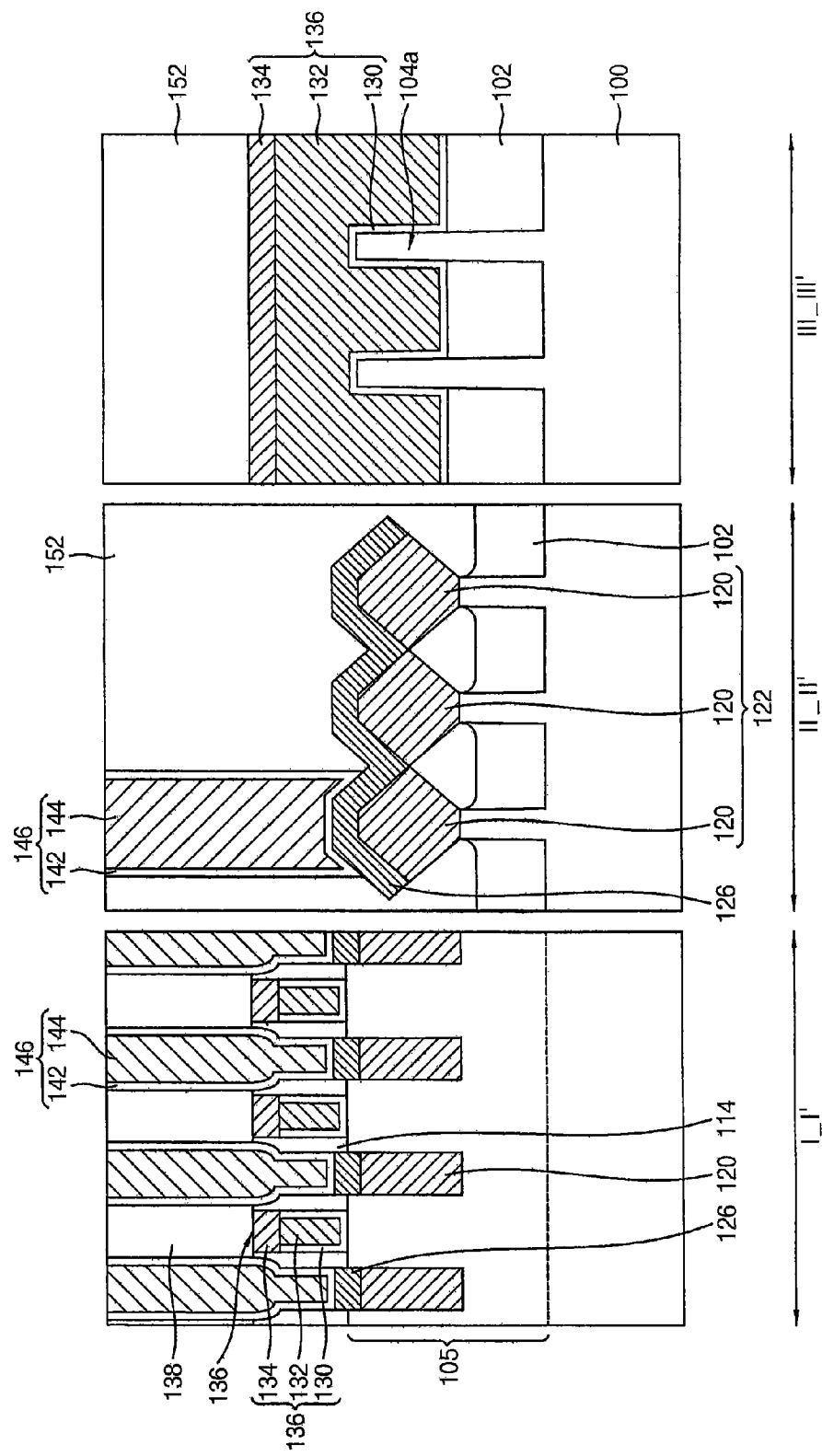

Referring to FIG. 17, an insulating interlayer 152 covering the gate structures 136, the spacers 114, the epitaxial layer structure 122, the metal silicide pattern 126 and the isolation layer 102 may be formed on the substrate 100. The insulating interlayer 152 may be formed to include, e.g., silicon oxide.

A contact structure 146 may be formed through the insulating interlayers 152, and may contact a first upper surface of the metal silicide pattern 126. In example embodiments, a plurality of the contact structures 146 may be formed in the first direction. The contact structure 146 may include a barrier layer pattern 142 and metal layer pattern 144 sequentially stacked. In example embodiments, processes substantially the same as or similar to that illustrated with reference to FIGS. 11 and 12 may be performed to form the contact structure 146.

A conductive pattern may be further formed on the contact structure 146. In example embodiments, the conductive pattern may include, e.g., a pad electrode, a conductive line, etc.

Figure 18:
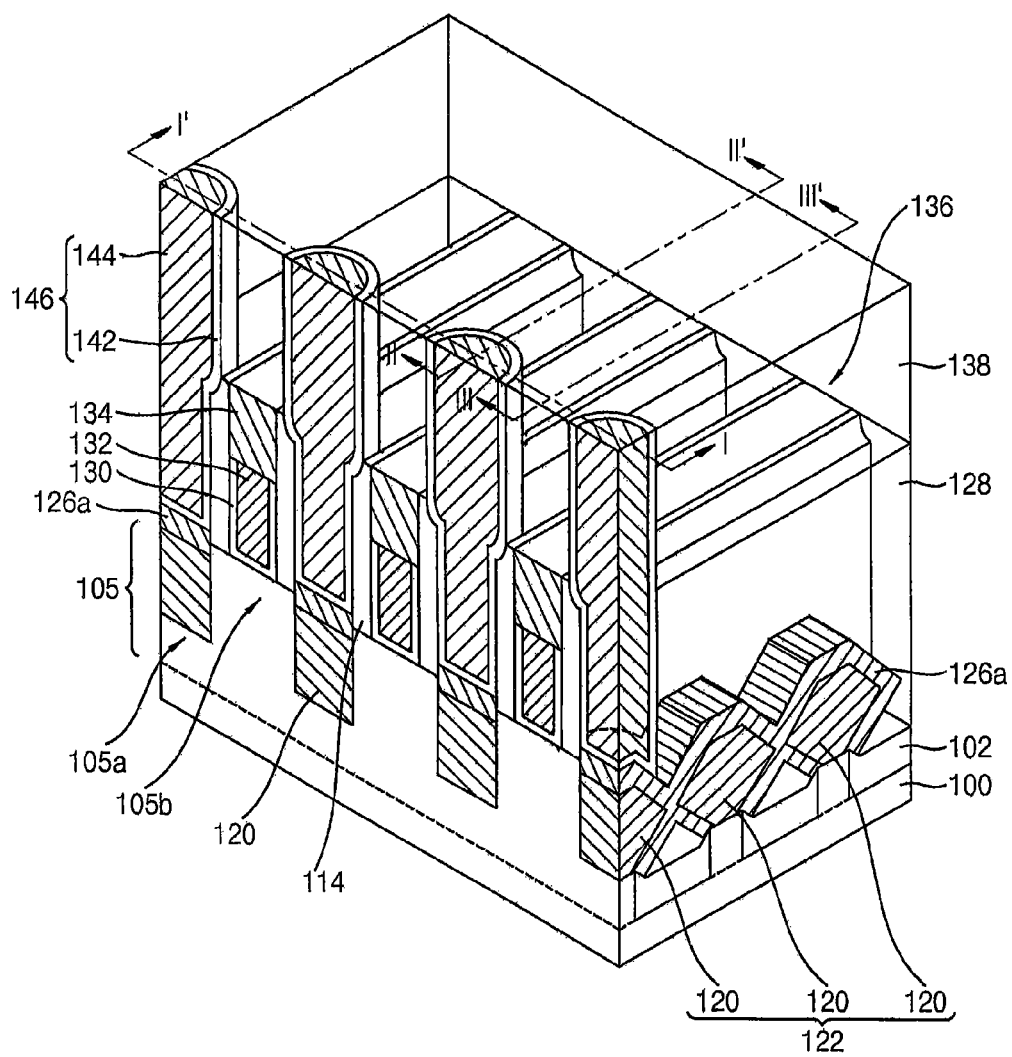
Figure 19:
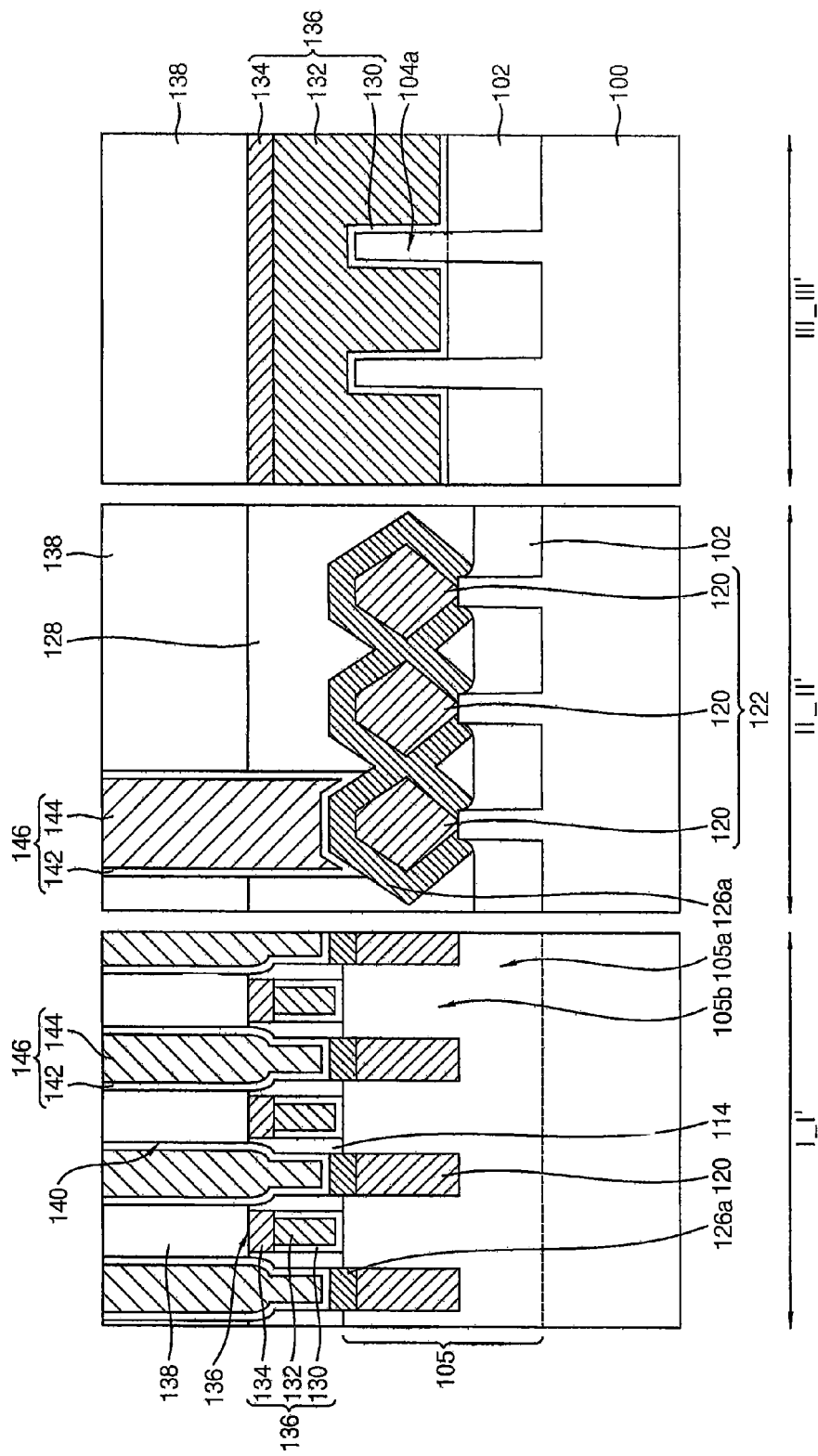

FIGS. 18 and 19 are a perspective view and a cross-sectional view, respectively, illustrating a semiconductor device including a FinFET in accordance with example embodiments. The semiconductor device may be substantially the same as or similar to that illustrated in FIGS. 1 and 2, except for the shape of the metal silicide pattern. Thus, like reference numerals refer to like elements, and detailed descriptions thereon may be omitted herein.

Referring to FIGS. 18 and 19, the semiconductor device may include a substrate 100, an active fin structure 105, a gate structure 136, an epitaxial layer structure 122, a metal silicide pattern 126 and a contact structure 146. The semiconductor device may further include an isolation layer 102 and spacers 114.

The metal silicide pattern 126a may directly contact epitaxial layer pattern 120 and/or the epitaxial layer structure 122, and cover entire upper and lower surfaces of the epitaxial layer structure 122. In example embodiments, the metal silicide pattern 126a may be conformally formed on the epitaxial layer structure 122. The metal silicide pattern 126a may be formed adjacent to sidewalls of the gate structures 136, and may extend in the second direction.

In example embodiments, the plurality of epitaxial layer patterns 120 disposed in the second direction may be spaced apart from each other by a very small distance. In this case, the metal silicide pattern 126a may be formed on the epitaxial layer patterns 120 and a gap between the epitaxial layer patterns 120. Thus, the epitaxial layer patterns 120 disposed in the second direction by a very small distance may be electrically connected to each other via the metal silicide pattern 126a.

Alternatively, the epitaxial layer patterns 120 disposed in the second direction may contact each other, the epitaxial layer patterns 120 may be electrically connected to each other. In this case, the metal silicide pattern 126a may be formed on upper and lower surfaces of the epitaxial layer patterns 120.

Figure 20:
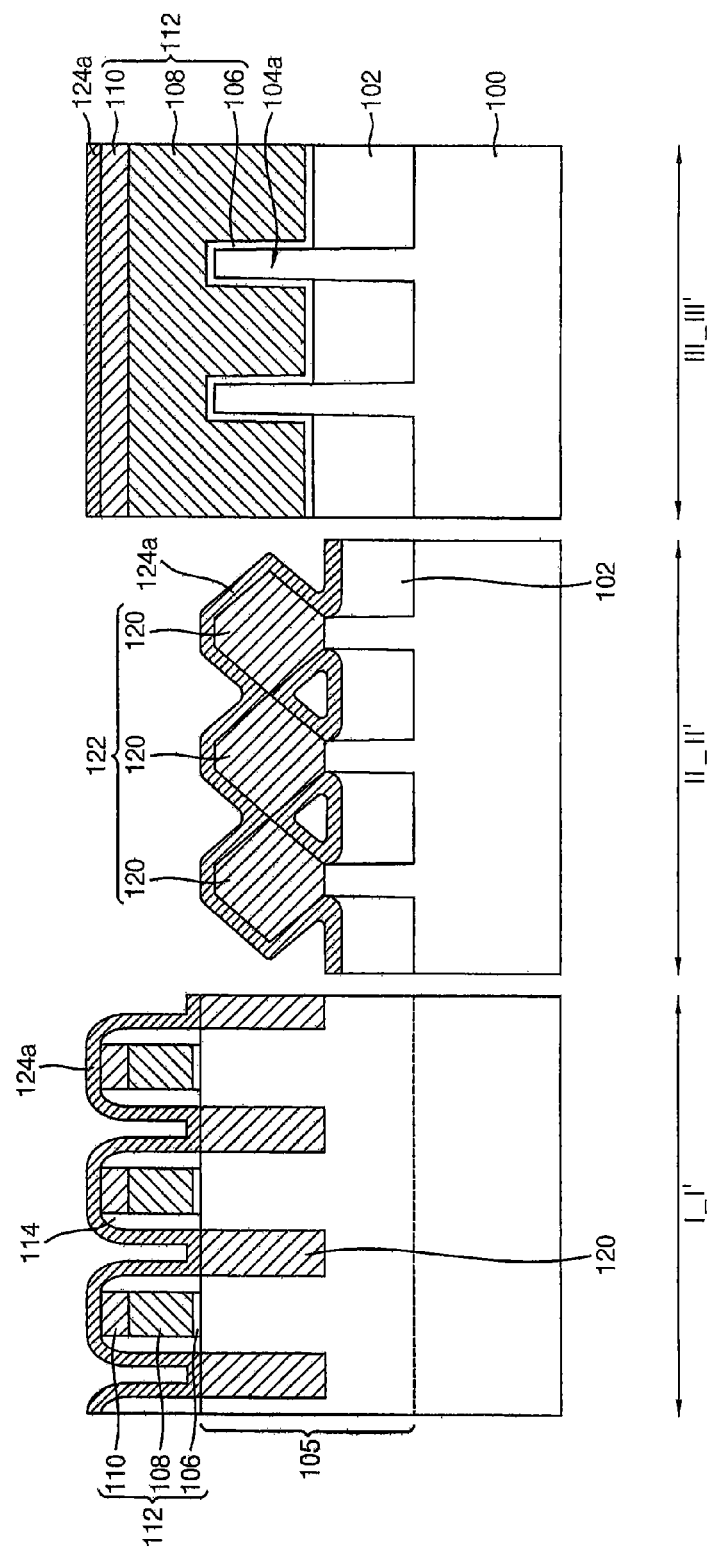

FIG. 20 is cross-sectional view illustrating stage of a method of manufacturing the semiconductor device in accordance with example embodiments.

First, processes substantially the same as or similar to those illustrated with reference to FIGS. 3 to 5 may be performed.

Referring to FIG. 20, a metal layer 124a may be formed on the gate structures 112, the epitaxial layer structure 122 and the isolation layer 102. The metal layer 124a may be formed by a chemical vapor deposition (CVD) process. In this case, the metal layer 124a may be conformally formed on the gate structures 112, the isolation layer 102 and entire upper and lower surfaces of the epitaxial layer structure 122. The metal layer 124a may be formed to include, e.g., cobalt, titanium, tantalum, molybdenum, nickel, tungsten, etc.

After forming the metal layer 124a, processes substantially the same as or similar to that illustrated with reference to FIGS. 7 to 12 may be performed to form the semiconductor device shown in FIGS. 18 and 19.

Alternatively, processes substantially the same as or similar to those illustrated with reference to FIGS. 3 to 5, 13 and 14 may be sequentially performed. Then, the sacrificial insulation layer 150 may be removed. After removing the sacrificial insulation layer 150, a metal layer may be formed on the gate structures 136, the epitaxial layer structure 122 and the isolation layer 102 by a chemical vapor deposition (CVD) process, and may be annealed to form a metal silicide pattern 126a. After forming the metal layer, process(es) substantially the same as or similar to that illustrated with reference to FIG. 17 may be performed to form the semiconductor device shown in FIGS. 18 and 19.

Figure 21:
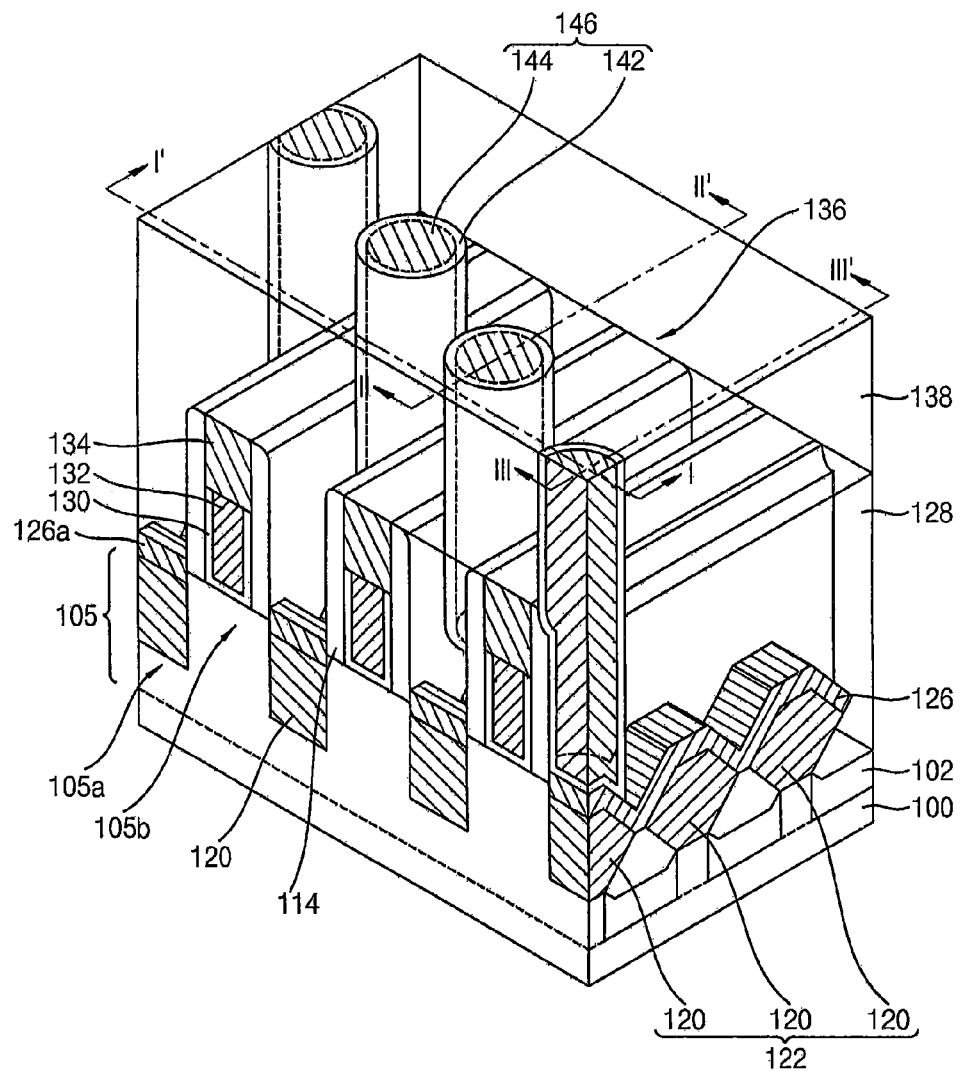
Figure 22:
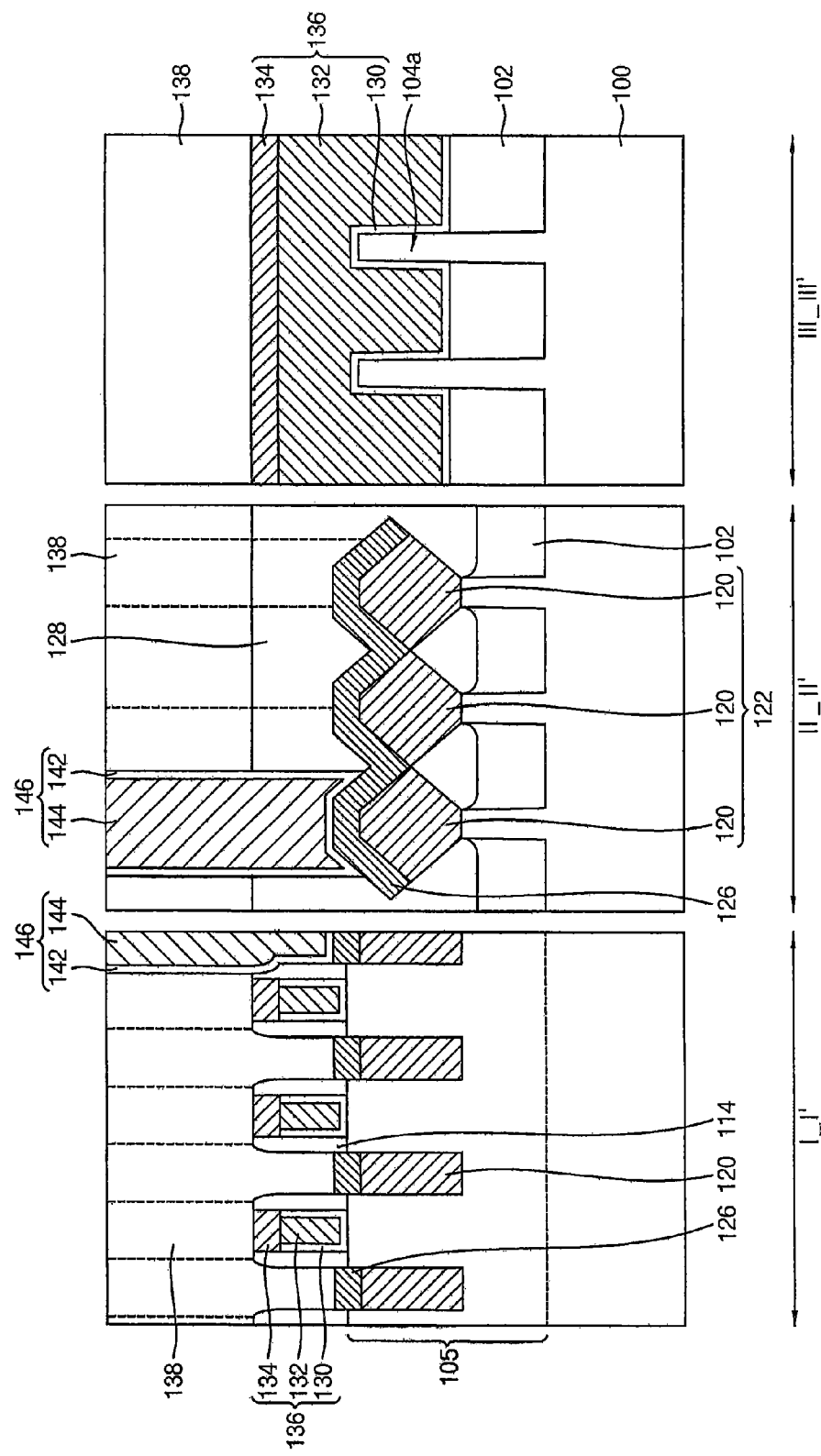

FIGS. 21 and 22 are a perspective view and a cross-sectional view, respectively, illustrating a semiconductor device including a FinFET in accordance with example embodiments. The semiconductor device may be substantially the same as or similar to that illustrated in FIGS. 1 and 2, except for arrangements of the contact structures. Thus, like reference numerals refer to like elements, and detailed descriptions thereon may be omitted herein.

Referring to FIGS. 21 and 22, the semiconductor device may include a substrate 100, an active fin structure 105, a gate structure 136, an epitaxial layer structure 122, a metal silicide pattern 126 and a contact structure 146. The semiconductor device may further include an isolation layer 102 and spacers 114.

In example embodiments, a plurality of contact structures 146 may be formed in a direction neither parallel nor perpendicular to (e.g., a direction that intersects but does not form a right angle with) the first direction, and only one of the contact structures 146 may be formed on the metal silicide pattern 126 on each of the epitaxial layer structures 122. Alternatively, a plurality of contact structures 146 may be formed on the metal silicide pattern 126 on each of the epitaxial layer structures 122.

In example embodiments, the contact structures 146 may be formed in a direction having an acute angle with the first direction. Alternatively, the contact structures 146 may be formed in a zig-zag fashion.

The semiconductor device shown in FIGS. 21 and 22 may be manufactured by performing processes substantially the same as or similar to those illustrated with reference to FIGS. 3 to 12. However, when a process substantially the same as or similar to that illustrated with reference to FIG. 11 is performed, the contact holes may be formed in the direction having the acute angle with the first direction.

Alternatively, the semiconductor device shown in FIGS. 21 and 22 may be manufactured by performing processes substantially the same as or similar to those illustrated with reference to FIGS. 14 to 17. However, the contact holes may be formed in the direction having the acute angle with the first direction.

Figure 23:
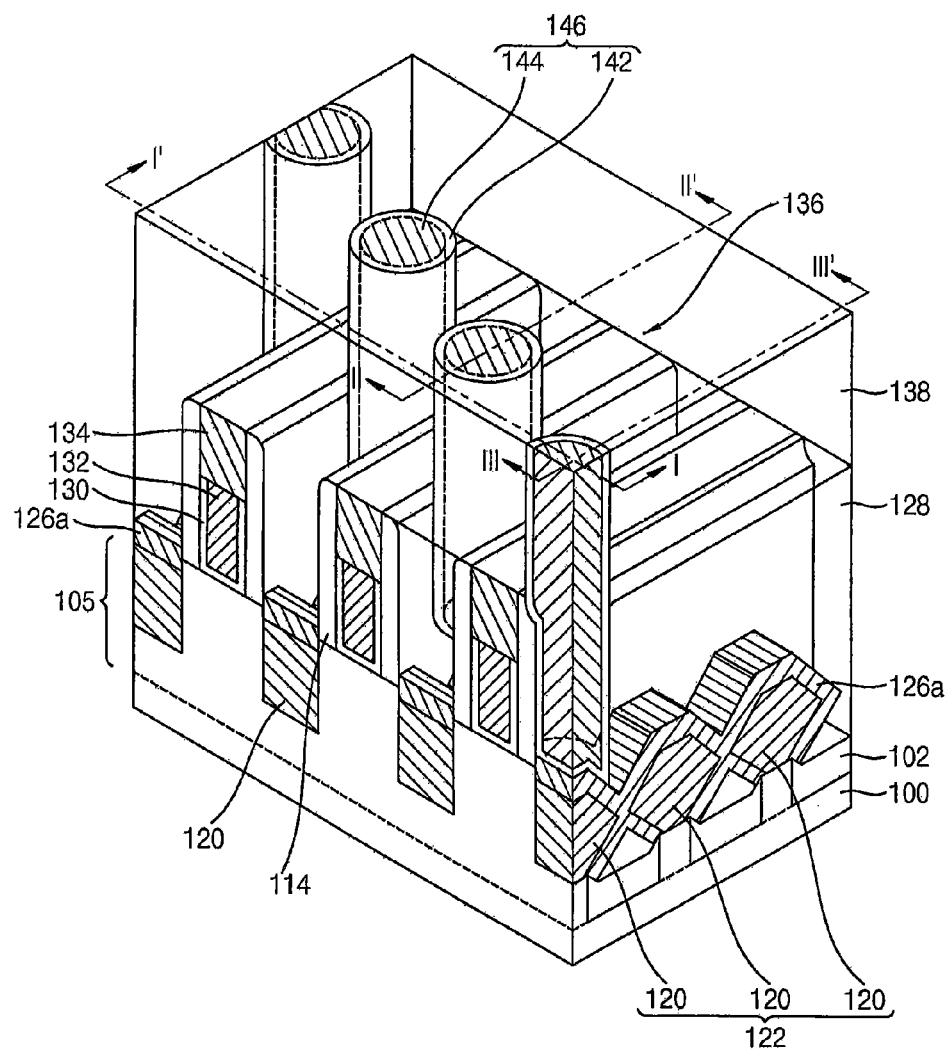
Figure 24:
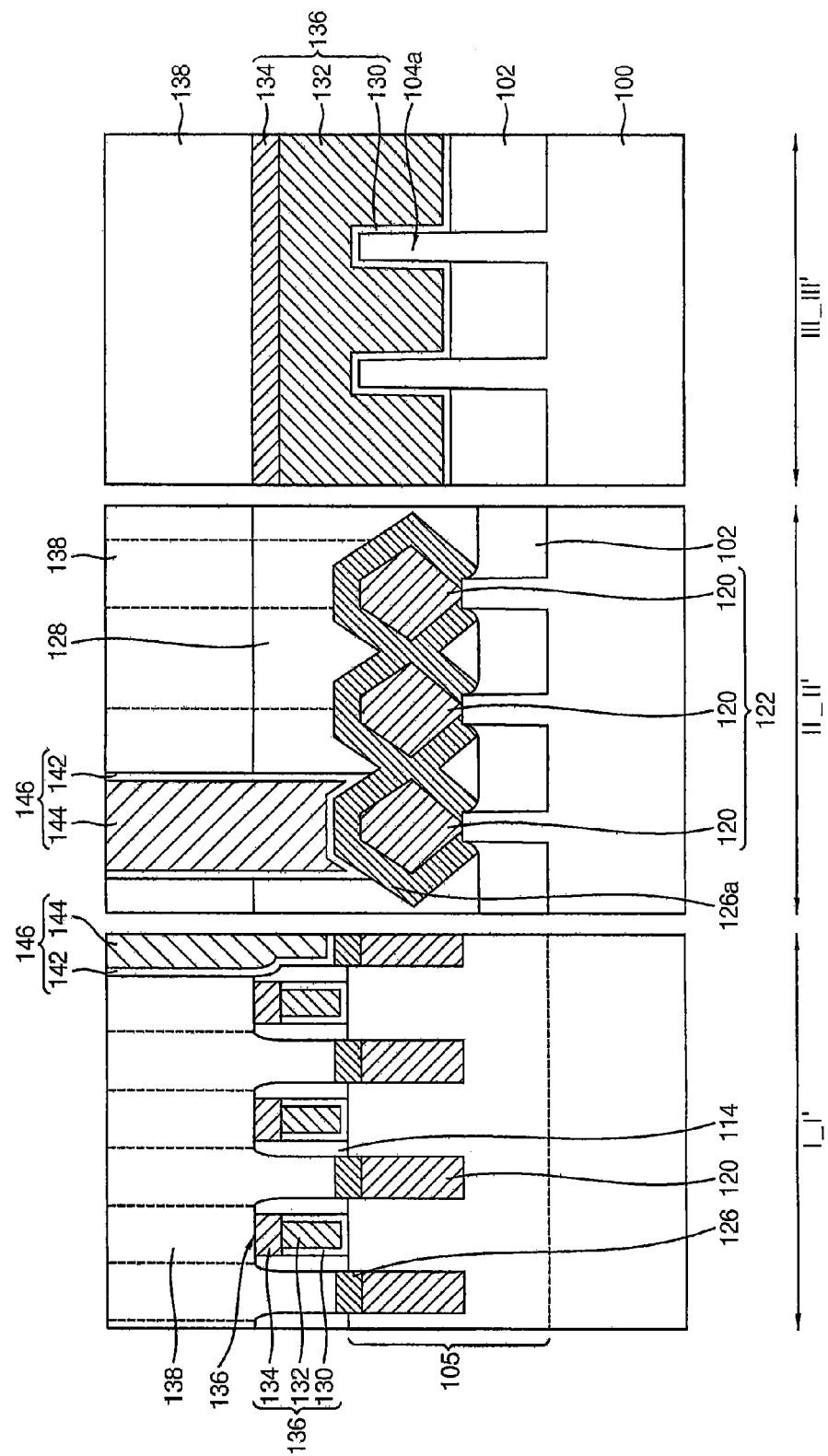

FIGS. 23 and 24 are a perspective view and a cross-sectional view, respectively, illustrating a semiconductor device including a FinFET in accordance with example embodiments. The semiconductor device may be substantially the same as or similar to that illustrated in FIGS. 18 and 19, except for arrangements of the contact structures. Thus, like reference numerals refer to like elements, and detailed descriptions thereon may be omitted herein.

Referring to FIGS. 23 and 24, the semiconductor device may include a substrate 100, an active fin structure 105, a gate structure 136, an epitaxial layer structure 122, a metal silicide pattern 126a and a contact structure 146. The semiconductor device may further include an isolation layer 102 and spacers 114.

In example embodiments a plurality of contact structures 146 may be formed in a direction neither parallel nor perpendicular to the first direction, and only one of the contact structures 146 may be formed on the metal silicide pattern 126 on each of the epitaxial layer structures 122. Alternatively, ones of the plurality of contact structures 146 may be formed on the metal silicide pattern 126 on each of the epitaxial layer structures 122.

In example embodiments, the contact structures 146 may be formed in a direction having an acute angle with the first direction. Alternatively, the contact structures 146 may be formed in a zig-zag fashion.

The semiconductor device shown in FIGS. 23 and 24 may be manufactured by performing process substantially the same as or similar to those illustrated with reference to FIG. 20. However, the contact holes may be formed in the direction having an acute angle with the first direction.

In some embodiments of present inventive concepts, a three dimensional (3D) memory array may be provided. The 3D memory array may be monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In some embodiments of present inventive concepts, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

A vertical semiconductor device including the 3D memory array may include the FinFET and the contact structure device in accordance with example embodiments.

The above semiconductor device may be applied to various types of systems, e.g., computing system.

Figure 25:
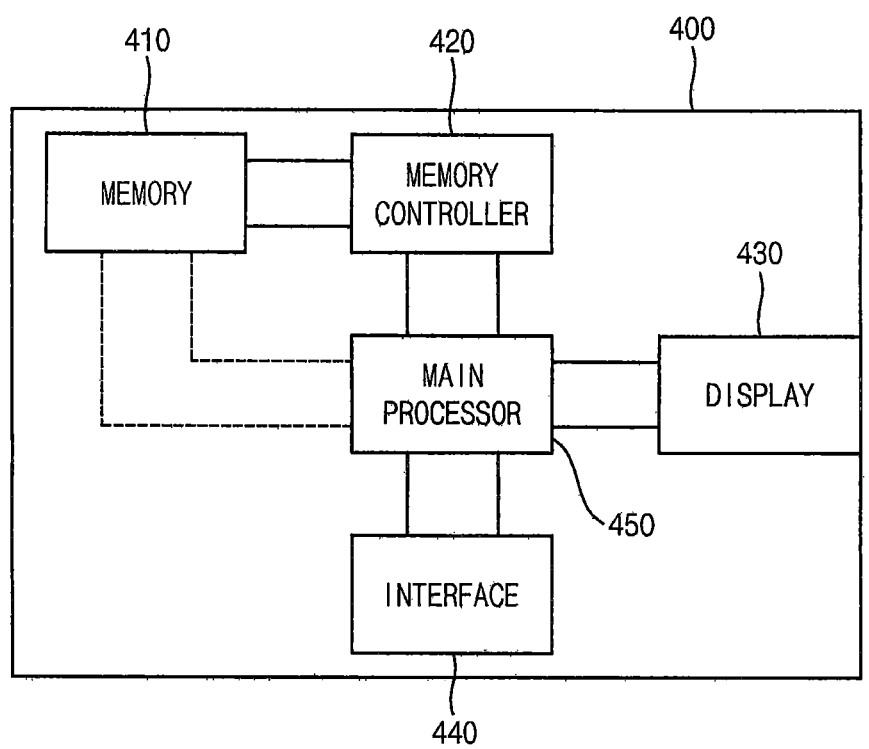

FIG. 25 is a block diagram illustrating a system in accordance with example embodiments.

Referring to FIG. 25, a system 400 may include a memory device 410, a memory controller 420 for controlling operations of the memory device 410, a displayer (e.g., a display device 430) for outputting data, an interface 440 for receiving data, and a main processor 450 for controlling elements in the system 400.

The memory device 410 may include a semiconductor device formed on the active structure in accordance with example embodiments. The memory device 410 may be directly connected to the main processor 450. Alternatively, the memory device 410 may be electrically connected to the main processor 450 via a bus. The system 400 may be applied to a computer, a portable computer, a laptop computer, a personal digital assistant, a tablet personal computer, a mobile phone, a digital music player, etc.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
a substrate;
an isolation layer defining active portions of the substrate that are spaced apart from each other in a direction;
an epitaxial layer on the active portions;
a metal silicide layer on the epitaxial layer; and
a contact structure that only partially overlaps the metal silicide layer on the epitaxial layer, wherein:
the epitaxial layer comprises a plurality of epitaxial patterns on respective ones of the active portions of the substrate;
each of the plurality of epitaxial patterns comprises a polygonal shape; and
the metal silicide layer is on a plurality of sides of the polygonal shape of each of the plurality of epitaxial patterns.

2. The device of claim 1, further comprising an insulating interlayer on the metal silicide layer, wherein the contact structure is in a contact hole in the insulating interlayer.

3. The device of claim 2, wherein the contact structure is on less than half of an entire uppermost surface of the metal silicide layer.

4. The device of claim 2, wherein a first thickness of a first portion of the metal silicide layer underlying the contact structure is thinner than a second thickness of a second portion of the metal silicide layer underlying the insulating interlayer.

5. The device of claim 1, wherein:
the epitaxial layer comprises an epitaxial source/drain region of a fin-shaped Field Effect Transistor (FinFET); and
the metal silicide layer is on the epitaxial source/drain region.

6. The device of claim 1, wherein the direction in which the active portions of the substrate are spaced apart comprises a first direction, the device further comprising metal gate structures that are spaced part from each other in a second direction on an active fin structure.

7. The device of claim 1, wherein the metal silicide layer is on at least three sides of the polygonal shape of each of the plurality of epitaxial patterns.

8. The device of claim 1, wherein the metal silicide layer is on at least five sides of the polygonal shape of each of the plurality of epitaxial patterns.

9. The device of claim 1, wherein:
the plurality of epitaxial patterns comprise respective first through third ones of the polygonal shapes; and
the second polygonal shape contacts each of the first and third polygonal shapes.

10. The device of claim 1, wherein:
the plurality of epitaxial patterns comprise gaps therebetween; and
the metal silicide layer electrically connects the plurality of epitaxial patterns with each other.

11. The device of claim 1, wherein the contact structure overlaps only one of the plurality of epitaxial patterns.

12. The device of claim 1, wherein:
the direction in which the active portions of the substrate are spaced apart comprises a first direction;
the epitaxial layer comprises a first plurality of epitaxial patterns and a second plurality of epitaxial patterns that is spaced apart from the first plurality of epitaxial patterns in a second direction; and
the contact structure comprises first and second contact structures on the first plurality of epitaxial patterns and the second plurality of epitaxial patterns, respectively.

13. The device of claim 12, wherein the first and second contact structures are in a pattern that defines an acute angle with the second direction.

14. A semiconductor device comprising:
a substrate;
an isolation layer defining active portions of the substrate that are spaced apart from each other in a direction;
an epitaxial layer on the active portions;
a metal silicide layer on the epitaxial layer; and
a contact structure that only partially overlaps the metal silicide layer on the epitaxial layer, wherein:
the direction in which the active portions of the substrate are spaced apart comprises a first direction;
the epitaxial layer comprises first through third pluralities of epitaxial patterns that are spaced apart from each other in a second direction; and
the contact structure comprises first through third contact structures on the first through third pluralities of epitaxial patterns, respectively, and are at different positions from each other in the first direction when viewed in a plan view.

15. The device of claim 14, wherein the first through third contact structures on the first through third pluralities of epitaxial patterns, respectively, define a zig-zag pattern when viewed in the plan view.

16. The device of claim 1, further comprising a metal gate structure,
wherein the epitaxial layer comprises first and second epitaxial source/drain patterns on first and second sides, respectively, of the metal gate structure.

17. The device of claim 1, wherein the metal silicide layer extends to a portion of the epitaxial layer that is spaced apart from the contact structure.

18. A semiconductor device comprising:
a substrate comprising a plurality of fin-shaped patterns;
a plurality of metal gate structures on respective ones of the plurality of fin-shaped patterns;
a plurality of epitaxial source/drain patterns on the plurality of fin-shaped patterns;
a plurality of metal silicide layers on respective ones of the plurality of epitaxial source/drain patterns, wherein each of the metal silicide layers extends continuously from a first portion of its respective epitaxial source/drain pattern that is on a first of the plurality of fin-shaped patterns to a second portion of its respective epitaxial source/drain pattern that is on a second of the plurality of fin-shaped patterns; and
a plurality of contact structures on, and only partially overlapping, respective ones of the plurality of metal silicide layers.

19. The device of claim 18, wherein:
the plurality of metal silicide layers are on entireties of surface areas of respective uppermost surfaces of the plurality of epitaxial source/drain patterns; and
the plurality of contact structures are on less than half of surface areas of respective uppermost surfaces of the plurality of metal silicide layers.

* * * * *